US012777749B2

(12) United States Patent
Shin et al.

(10) Patent No.: US 12,777,749 B2
(45) Date of Patent: Oct. 27, 2026

(54) DISPLAY DEVICE

(71) Applicant: Samsung Display Co., LTD., Yongin-si (KR)

(72) Inventors: Hyun Eok Shin, Yongin-si (KR); Do Keun Song, Yongin-si (KR); Su Kyoung Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 391 days.

(21) Appl. No.: 18/600,531

(22) Filed: Mar. 8, 2024

(65) Prior Publication Data

US 2024/0313163 A1 Sep. 19, 2024

(30) Foreign Application Priority Data

Mar. 17, 2023 (KR) ........................ 10-2023-0035161

(51) Int. Cl.
*H10H 20/831* (2025.01)
*H10H 20/01* (2025.01)
(Continued)

(52) U.S. Cl.
CPC ........ *H10H 20/831* (2025.01); *H10H 20/835* (2025.01); *H10H 20/851* (2025.01);
(Continued)

(58) Field of Classification Search
CPC .. H10H 20/831; H10H 20/835; H10H 20/851; H10H 20/032; H10H 20/034;
(Continued)

(56) References Cited

U.S. PATENT DOCUMENTS 7,795,808 B2 9/2010 Matsuura et al.
8,692,254 B2 4/2014 Lee
(Continued)

FOREIGN PATENT DOCUMENTS

CN 108735153 A 11/2018
JP 5117001 B2 1/2013
(Continued)

*Primary Examiner* — J. E. Schoenholtz
(74) *Attorney, Agent, or Firm* — Womble Bond Dickinson (US) LLP

(57) ABSTRACT

A display device includes: a substrate having an emission area and a non-emission area; an insulating layer covering a circuit element on the substrate, the insulating layer including a contact part exposing a portion of the circuit element; a conductive pattern on the insulating layer and electrically connected to the circuit element through the contact part; a first electrode on the insulating layer and integrally formed with the conductive pattern; a pixel defining layer over the first electrode, the pixel defining layer including an opening exposing a portion of the first electrode; a light emitting layer on the first electrode; and a second electrode on the light emitting layer, wherein the conductive pattern and the first electrode include a first layer, a second layer, and a third layer, which are sequentially stacked on one surface of the insulating layer, and wherein the second layer includes an aluminum-nickel-lanthanum-based alloy.

20 Claims, 16 Drawing Sheets

(51) Int. Cl.
*H10H 20/80* (2025.01)
*H10H 20/832* (2025.01)
*H10H 20/851* (2025.01)

(52) U.S. Cl.
CPC ......... *H10H 20/032* (2025.01); *H10H 20/034* (2025.01); *H10H 20/0361* (2025.01); *H10H 20/872* (2025.01)

(58) Field of Classification Search
CPC ............. H10H 20/0361; H10H 20/872; H10K 59/131; H10K 59/1201; H10K 59/35; H10K 59/8051; H10K 50/17; H10K 59/124; H10K 59/38; H10K 59/8722; H10K 59/873; H10K 59/8792
See application file for complete search history.

(56) References Cited

U.S. PATENT DOCUMENTS

| | | | | |
|---|---|---|---|---|
| 9,564,609 | B2 * | 2/2017 | Sasaki | H10K 50/818 |
| 11,322,552 | B2 | 5/2022 | Kim et al. | |
| 11,462,711 | B2 * | 10/2022 | Shin | H10K 59/80518 |
| 2021/0226153 | A1 * | 7/2021 | Shin | H10K 59/80518 |
| 2024/0215291 | A1 * | 6/2024 | Sasagawa | H10K 71/40 |
| 2025/0126993 | A1 * | 4/2025 | Sasagawa | G09F 9/00 |

FOREIGN PATENT DOCUMENTS

| | | | |
|---|---|---|---|
| KR | 10-1822563 | B1 | 3/2018 |
| KR | 10-2020-0080729 | A | 7/2020 |
| KR | 10-2479472 | B1 | 12/2022 |
| WO | WO 2014-171336 | A1 | 10/2014 |

* cited by examiner

| CLASSIFICATION | HEAT TREATMENT EVALUATION | | | |
|---|---|---|---|---|
| EMBODIMENT |  X20 |  X50 |  X100 | HILLOCK FREE |
| COMPARATIVE EXAMPLE 1 |  X20 |  X50 |  X100 | HILLOCK APPEARS |
| COMPARATIVE EXAMPLE 2 |  X20 |  X50 |  X100 | HILLOCK APPEARS |
| COMPARATIVE EXAMPLE 3 |  X20 |  X50 |  X100 | HILLOCK APPEARS |
| COMPARATIVE EXAMPLE 4 |  X20 |  X50 |  X100 | HILLOCK APPEARS |

DISPLAY DEVICE

CROSS-REFERENCE TO RELATED APPLICATION

The present application claims priority to and the benefit of Korean patent application No. 10-2023-0035161 filed on Mar. 17, 2023 in the Korean Intellectual Property Office, the entire disclosure of which is incorporated herein by reference.

BACKGROUND

1. Field

Aspects of some embodiments of the present disclosure generally relate to a display device.

2. Description of the Related Art

Recently, as interest in information displays has increased, research and development of display devices has been continuously conducted.

The above information disclosed in this Background section is only for enhancement of understanding of the background and therefore the information discussed in this Background section does not necessarily constitute prior art.

SUMMARY

Aspects of some embodiments include a display device having relatively improved manufacturing efficiency and relatively improved reliability.

According to some embodiments of the present disclosure, a display device includes: a substrate on which an emission area and a non-emission area are defined; an insulating layer covering a circuit element on the substrate, the insulating layer including a contact part exposing a portion of the circuit element; a conductive pattern on the insulating layer, the conductive pattern being electrically connected to the circuit element through the contact part; a first electrode on the insulating layer, the first electrode being integrally formed with the conductive pattern; a pixel defining layer over the first electrode, the pixel defining layer including an opening exposing a portion of the first electrode; a light emitting layer on the first electrode; and a second electrode on the light emitting layer. According to some embodiments, the conductive pattern and the first electrode include a first layer, a second layer, and a third layer, which are sequentially stacked on one surface of the insulating layer.

According to some embodiments, the second layer may include an aluminum-nickel-lanthanum-based alloy.

According to some embodiments, the substrate may include a silicon wafer substrate.

According to some embodiments, the second layer may include aluminum of 99.94 at %, nickel of 0.02 at %, and lanthanum of 0.04 at %.

According to some embodiments, the first layer, the second layer, and the third layer may include different materials.

According to some embodiments, the first layer may include titanium, and the third layer may include tungsten oxide.

According to some embodiments, the conductive pattern and the first electrode may further include a fourth layer on the third layer. The fourth layer may include a transparent conductive material.

According to some embodiments, the second layer may have a thickness thicker than a thickness of each of the first, third, and fourth layers.

According to some embodiments, the first layer may be in direct contact with the circuit element through the contact part.

According to some embodiments, the circuit element may include a gate insulating layer, a gate electrode on the gate insulating layer, and source and drain regions in the substrate at both sides of the gate electrode. According to some embodiments, one of the source and drain regions may be connected to the first layer while being in direct contact with the first layer through the contact part.

According to some embodiments, the first layer may be a barrier layer, the second layer may be a reflective layer, the third layer may be an ohmic contact layer, and the fourth layer may be a hole injection layer.

According to some embodiments, the circuit element may include: a gate insulating layer; a gate electrode on the gate insulating layer; source and drain regions in the substrate at both sides of the gate electrode; a mutual connection part electrically connected to one of the source and drain regions; and a signal line electrically connected to the mutual connection part. According to some embodiments, the first layer may be electrically connected to the signal line through the contact part.

According to some embodiments, the display device may further include: a thin film encapsulation layer over the second electrode; a color filter layer on the thin film encapsulation layer; and an overcoat layer over the color filter layer.

According to some embodiments, the color filter layer may include: a color filter on the thin film encapsulation layer in the emission area; and a light blocking pattern on the thin film encapsulation layer in the non-emission area.

According to some embodiments, the color filter layer may include: a color filter on the thin film encapsulation layer in the emission area; and a dam part on the thin film encapsulation layer in the non-emission area. According to some embodiments, the dam part may include a first color filter, a second color filter, and a third color filter, which are sequentially stacked. According to some embodiments, the color filter may include one of the first, second, and third color filters.

According to some embodiments, the display device may further include a color conversion layer between the thin film encapsulation layer and the color filter layer. According to some embodiments, the color conversion layer may further include a bank on the thin film encapsulation layer in the non-emission area and a color conversion pattern on the thin film encapsulation layer in the emission area. According to some embodiments, the light emitting layer may emit blue series light.

According to some embodiments, the conductive pattern and the first electrode may correspond to a first conductive layer on the insulating layer.

According to some embodiments of the present disclosure, a display device includes first, second, and third sub-pixels each including an emission area and a non-emission area. According to some embodiments, each of the first, second, and third sub-pixels includes: a substrate; an insulating layer covering a circuit element on the substrate, the insulating layer including a contact part exposing a portion of the circuit element; a conductive pattern on the insulating layer, the conductive pattern being electrically connected to the circuit element through the contact part; a first electrode on the insulating layer, the first electrode being integrally formed with the conductive pattern; a pixel defining layer over the first electrode, the pixel defining layer including an opening exposing a portion of the first electrode; a light emitting layer on the first electrode; and a second electrode on the light emitting layer. According to some embodiments, the conductive pattern and the first electrode include a first layer, a second layer, a third layer, and a fourth layer, which are sequentially stacked on one surface of the insulating layer, and wherein the first layer, the second layer, the third layer, and the fourth layer include different materials.

According to some embodiments, the second layer may include an aluminum-nickel-lanthanum-based alloy.

According to some embodiments, the substrate may include a silicon wafer substrate.

According to some embodiments, the second layer may include aluminum of 99.94 at %, nickel of 0.02 at %, and lanthanum of 0.04 at %.

According to some embodiments, the first layer may include titanium, the third layer may include tungsten oxide, and the fourth layer may include indium tin oxide.

BRIEF DESCRIPTION OF THE DRAWINGS

Aspects of some example embodiments will now be described more fully hereinafter with reference to the accompanying drawings; however, they may be embodied in different forms and should not be construed as limited to the embodiments set forth herein. Rather, these embodiments are provided so that this disclosure will be more thorough and more complete, and will more fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
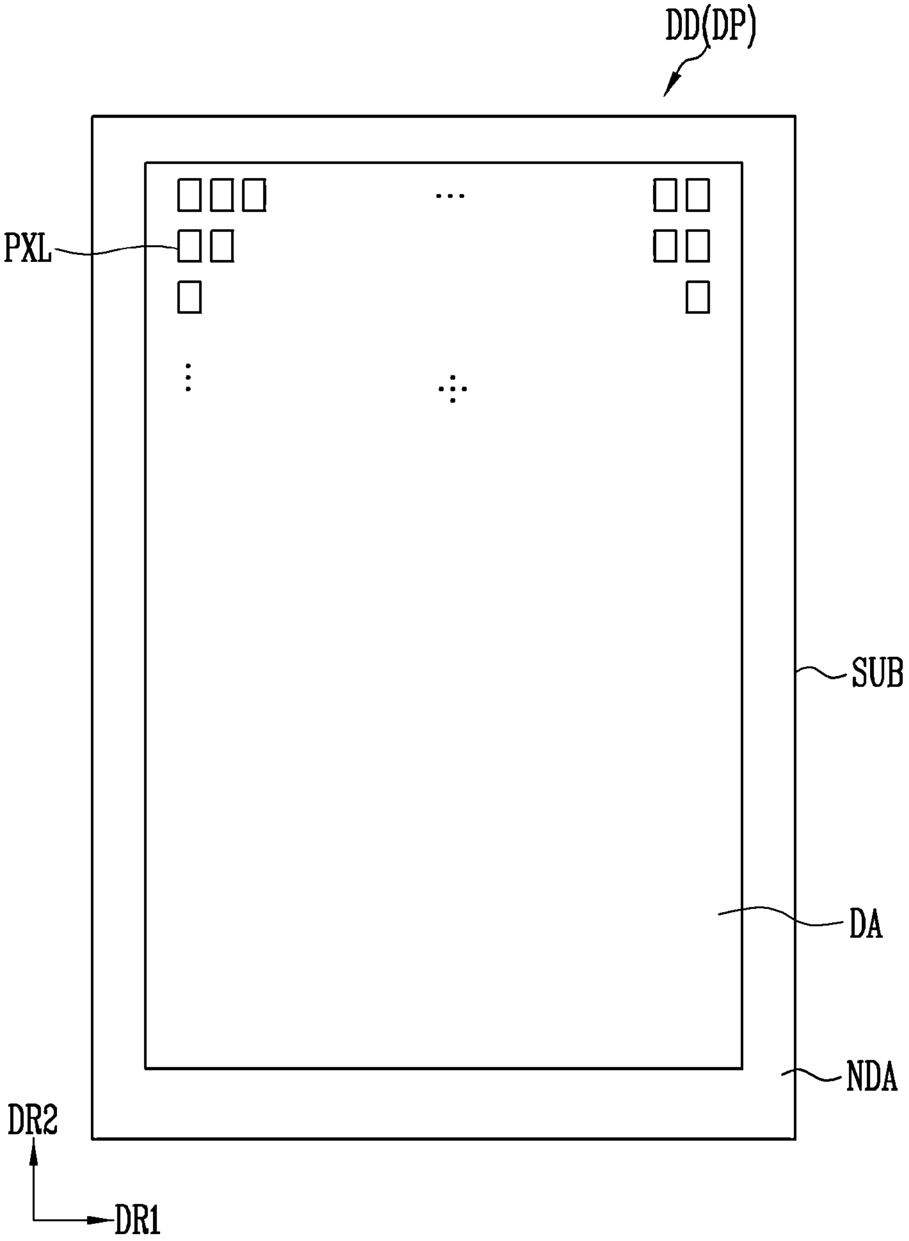
FIG. 1 is a plan view schematically illustrating a display device according to some embodiments of the present disclosure.

Embodiments according to the present disclosure may apply various changes and different shape, therefore the present disclosure illustrates aspects of some embodiments according to the present disclosure. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

In this specification, it will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. Also, in this specification, the term "connection" or "coupling" may inclusively mean connection or physical and/or electrical coupling.

Hereinafter, aspects of some embodiments of the present disclosure and items required for those skilled in the art to easily understand the content of the present disclosure will be described in detail with reference to the accompanying drawings. In the following description, singular forms in the present disclosure are intended to include the plural forms as well, unless the context clearly indicates otherwise.

FIG. 1 is a plan view schematically illustrating a display device DD according to some embodiments of the present disclosure.

In FIG. 1, for convenience of description, a structure of the display device DD, particularly, the display panel DP provided in the display device DD is briefly illustrated based on a display area DA at which images are displayed.

Referring to FIG. 1, the display device DD according to some embodiments of the present disclosure may include a substrate SUB, pixels PXL located on the substrate SUB, a driver which is provided on the substrate SUB and drives the pixels PXL, and lines electrically connecting the pixels PXL and the driver to each other.

The substrate SUB may be a silicon wafer substrate formed using a semiconductor process. The substrate SUB may include a semiconductor material, e.g., a Group IV semiconductor, a Group III-V compound semiconductor, or a Group II-VI compound semiconductor, but embodiments according to the present disclosure are not limited thereto.

One area on the substrate SUB may be provided as the display area DA such that the pixels PXL are located therein, and the other area on the substrate SUB may be provided as a non-display area NDA. For example, the substrate SUB may include the display area DA including pixel areas in which the respective pixels PXL are located and the non-display area NDA located at at least one side of the display area DA (or adjacent to the display area DA).

The display area DA may have various shapes. For example, the display area DA may be provided in various shapes such as a closed polygonal including linear sides, a circle, an ellipse or the like, including a curved side, and a semicircle or the like, including linear and curved sides.

The non-display area NDA may be provided at at least one side of the display area DA. For example, the non-display area NDA may surround a circumference (or edge) of the display area DA. That is, according to some embodiments, the non-display area NDA may be located in a periphery or outside a footprint of the display area DA.

The pixels PXL may be provided in the display area DA of the substrate SUB, and be electrically connected to the lines.

Each of the pixels PXL may include a light emitting element emitting white light and/or colored light and a pixel circuit for driving the light emitting element. The pixel circuit may include at least one transistor electrically connected to the light emitting element. Each pixel PXL may emit light of any one color among red, green, and blue. However, embodiments according to the present disclosure are not limited thereto, and each pixel PXL may emit light of one color among cyan, magenta, yellow, and white.

A plurality of pixels PXL may be arranged in a matrix form along rows (pixel rows) extending in a first direction DR1 and columns (or pixel columns) extending in a second direction DR2 intersecting the first direction DR1. However, the arrangement form of the pixels PXL is not particularly limited, and the pixels PXL may be arranged in various forms.

The driver may provide a signal to each pixel PXL through the lines, and accordingly, driving of each pixel PXL can be controlled. The driver may supply a data signal corresponding to an image data signal to the pixels PXL while sequentially scanning the pixels PXL of the display area DA. The display device DD may display an image corresponding to image data.

Figure 2:
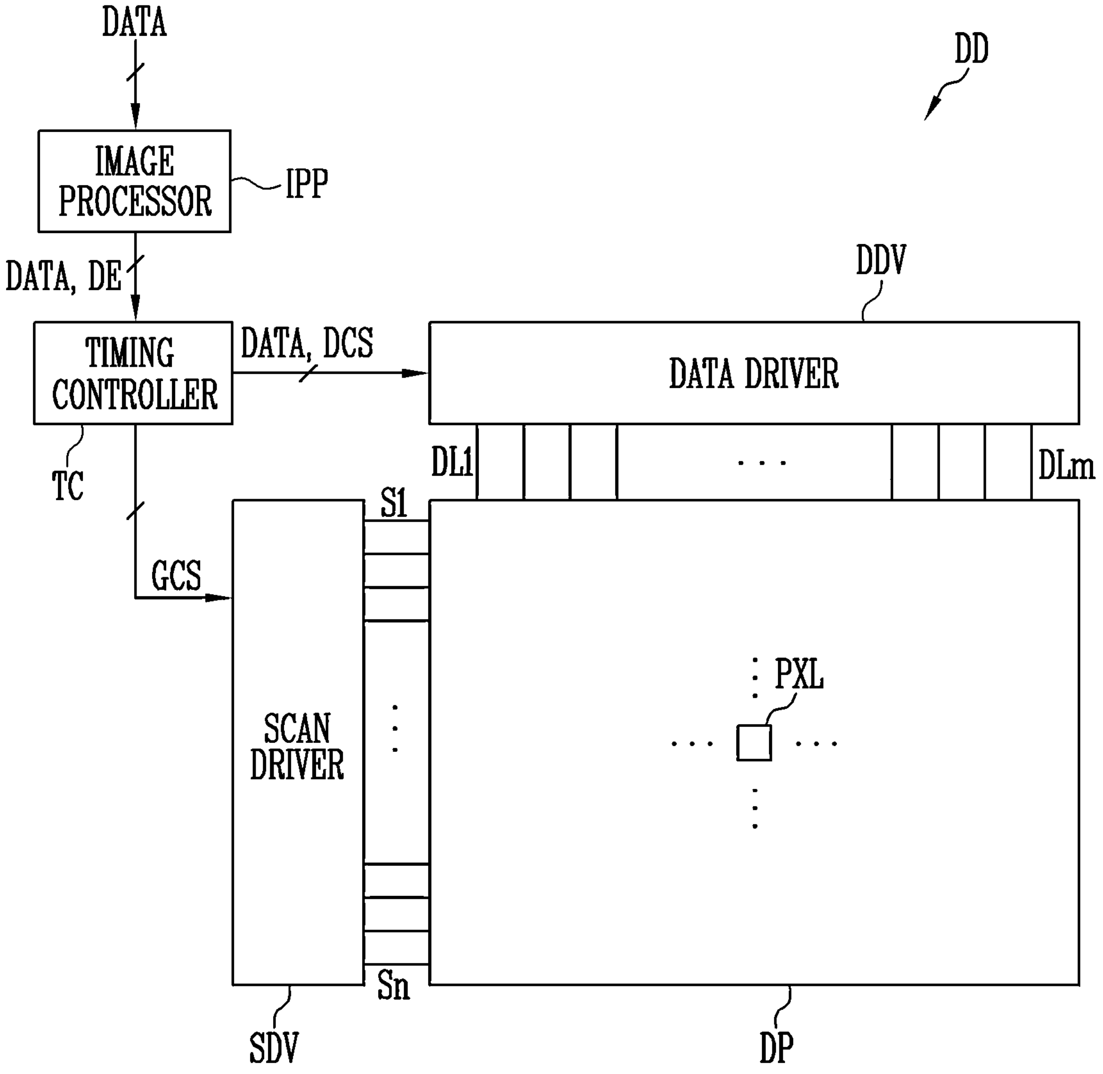
FIG. 2 is a schematic block diagram illustrating pixels and a driver in a display device according to some embodiments of the present disclosure.

FIG. 2 is a schematic block diagram illustrating pixels PXL and a driver in a display device DD according to some embodiments of the present disclosure.

Referring to FIGS. 1 and 2, the display device according to some embodiments of the present disclosure may include a display panel DP, a driver, and a line part.

The display panel DP may display images, corresponding to one or more data signals DATA supplied from a data driver DDV and one or more scan signals supplied from a scan driver SDV. The display panel DP may include a plurality of pixels PXL for displaying the image.

The driver may include an image processor IPP, a timing controller TC, the data driver DDV, and the scan driver SDV.

The image processor IPP may output a data enable signal DE and the like together with a data signal DATA supplied from the outside. The image processor IPP may output at least one of a vertical synchronization signal, a horizontal synchronization signal, or a clock signal, in addition to the data enable signal DE.

The timing controller TC may be receive the data enable signal DE or a driving signal including the vertical synchronization signal, the horizontal synchronization signal, the clock signal, and the like, and the data signal DATA, which are supplied from the image processor IPP. The timing controller TC may output a gate control signal GCS for controlling an operation timing of the scan driver SDV and a data control signal DCS for controlling an operation timing of the data driver DDV, based on the driving signal.

The data driver DDV may convert a data signal DATA signal DATA supplied from the timing controller TC into a corresponding data voltage and output the data voltage in response to the data control signal DCS supplied from the timing controller TC. The data driver DDV may supply the data voltage to data lines DL1 to DLm. The data voltage supplied to the data lines DL1 to DLm may be supplied to pixels PXL selected by a scan signal.

The scan driver SDV may apply a scan signal to scan lines S1 to Sn in response to the gate control signal GCS supplied from the timing controller TC. For example, in case that the scan driver SDV sequentially supplies the scan signal to the scan lines S1 to Sn, the pixels PXL may be sequentially selected in units of horizontal lines.

Figure 3:
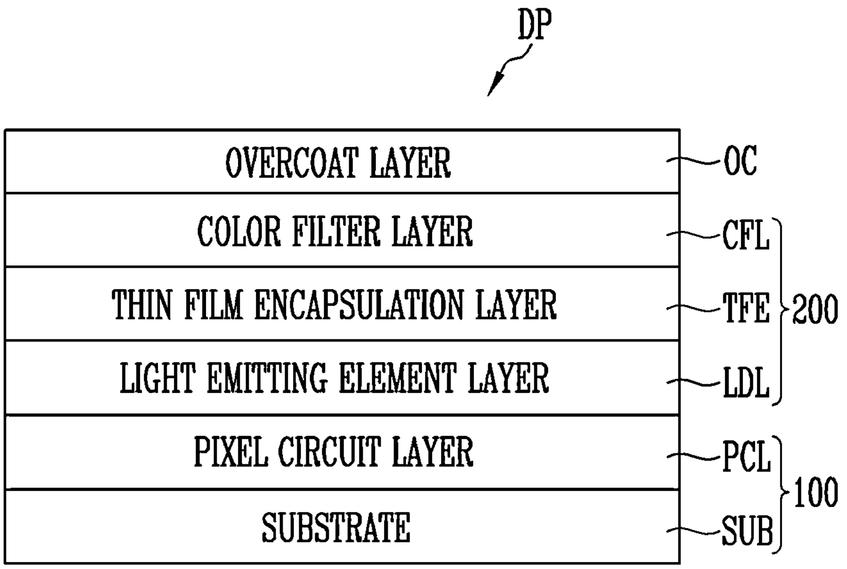
FIG. 3 is a schematic cross-sectional view illustrating a display panel according to some embodiments of the present disclosure.
Figure 4:
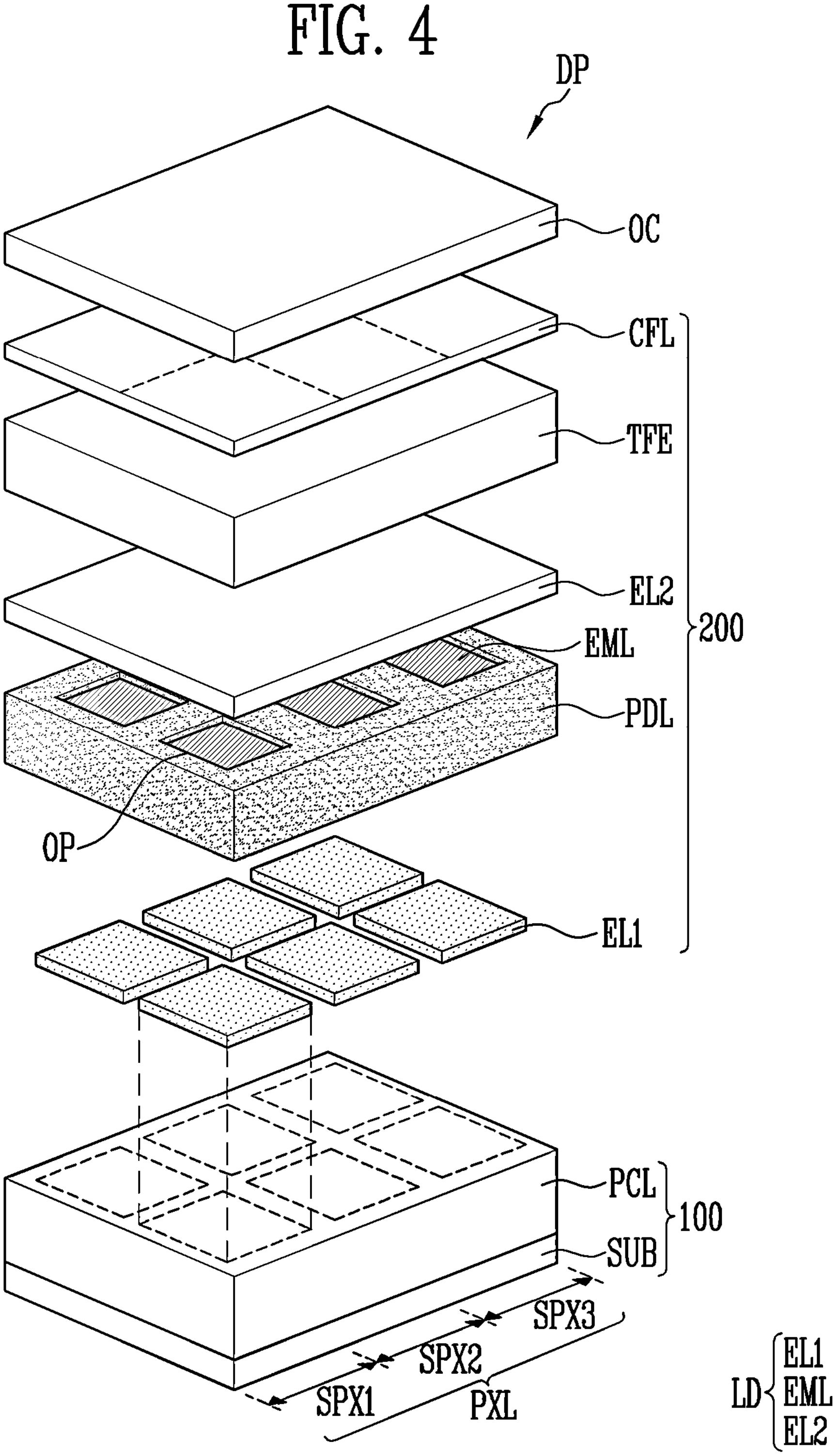
FIG. 4 is a schematic exploded perspective view illustrating a display panel according to some embodiments of the present disclosure.

FIG. 3 is a schematic cross-sectional view illustrating a display panel DP according to some embodiments of the present disclosure. FIG. 4 is a schematic exploded perspective view illustrating a display panel DP according to some embodiments of the present disclosure.

In relation to the embodiments shown in FIGS. 3 and 4, portions different from those of the above-described embodiments will be mainly described to avoid redundancy.

Referring to FIGS. 1 to 4, the display panel DP may include a plurality of pixels PXL.

Each of the pixels PXL may include a plurality of sub-pixels SPX1, SPX2, and SPX3. For example, each pixel PXL may include a first sub-pixel SPX1, a second sub-pixel SPX2, and a third sub-pixel SPX3, which are arranged adjacent to each other, but embodiments according to the present disclosure are not limited thereto. In some embodiments, each pixel PXL may include four sub-pixels or include two sub-pixels.

Each of the pixels PXL may include a circuit board 100, a display element layer 200 which is located on the circuit board 100 and includes a light emitting element LD, and an overcoat layer OC covering the display element layer 200.

The circuit board 100 may include a substrate SUB and a pixel circuit layer PCL.

The substrate SUB may include a semiconductor substrate. The substrate SUB may include a silicon bulk wafer or an epitaxial wafer. The epitaxial wafer may include a crystalline material layer, i.e., an epitaxial layer, grown on a bulk substrate through an epitaxial process. The substrate SUB is not limited to the bulk wafer or the epitaxial wafer, and may be formed using various wafers including a polished wafer, an annealed wafer, a Silicon On Insulator (SOI) wafer, and the like.

The pixel circuit layer PCL may be located on the substrate SUB, and include circuit elements and at least one insulating layer located between the circuit elements. The circuit elements may include a plurality of transistors and signal lines connected to the transistor. For example, the transistor may be a MOSFET, but embodiments according to the present disclosure are not limited thereto. The circuit element may include, for example, a gate electrode, source/drain regions, and a channel region.

The above-described circuit board 100 may be formed by applying a semiconductor process and equipment, but embodiments according to the present disclosure are not limited thereto.

The display element layer 200 may include a light emitting element layer LDL, a thin film encapsulation layer TFE, and a color filter layer CFL.

The light emitting element layer LDL may include the light emitting element LD and a pixel defining layer PDL. The light emitting element LD may be located in each of the first, second, and third sub-pixels SPX1, SPX2, and SPX3. The light emitting element LD may include a first electrode EL1, a light emitting layer EML, and a second electrode EL2. The first electrode EL1 may be an anode of the light emitting element LD, and the second electrode EL2 may be a cathode of the light emitting element LD.

In each of the first, second, and third sub-pixels SPX1, SPX2, and SPX3, holes injected from the first electrode EL1 and electrons injected from the second electrode EL2 may be transported into the light emitting layer EML to for an exciton. In case that the exciton is changed from an excited state to a ground state, light may be generated and emitted in the form of visible rays.

The first electrode EL1 may be located on the pixel circuit layer PCL. The first electrode EL1 may include an opaque conductive material having a reflectivity at which light can be reflected, but embodiments according to the present disclosure are not limited thereto.

The pixel defining layer PDL may be located on the first electrode EL1. The pixel defining layer PDL may include an opening OP exposing one area of the first electrode EL1.

The light emitting layer EML may be located on the first electrode EL1 exposed by the opening OP of the pixel defining layer PDL. The light emitting layer EML may include a light generation layer which emits light, an electron transport layer which transports electrons, a hole transport layer which transports holes, and the like, but embodiments according to the present disclosure are not limited thereto.

The second electrode EL2 may be located on the light emitting layer EML, thereby covering the light emitting layer EML. The second electrode EL2 may be commonly provided in the first, second, and third sub-pixels SPX1, SPX2, and SPX3.

The thin film encapsulation layer TFE may be located over the second electrode EL2. The thin film encapsulation layer TFE may cover the second electrode EL2, thereby preventing or reducing instances of contaminants, oxygen and/or moisture infiltrating into the light emitting element LD.

The color filter layer CFL may be located on the thin film encapsulation layer TFE. The color filter layer CFL may allow light emitted from the light emitting element LD to be selectively transmitted therethrough in an image display direction (or front direction) of the display device DD, but embodiments according to the present disclosure are not limited thereto.

The overcoat layer OC may be located on the pixels PXL having the above-described configuration. The overcoat layer OC may cover a lower member including the color filter layer CFL. The overcoat layer OC may protect the above-described lower member from a foreign matter such as dust. For convenience, a case where the overcoat layer OC is not included in each pixel PXL but is a separate component has been described in the above-described embodiments. However, embodiments according to the present disclosure are not limited thereto. The overcoat layer OC may be a partial component included in each pixel PXL.

Figure 5:
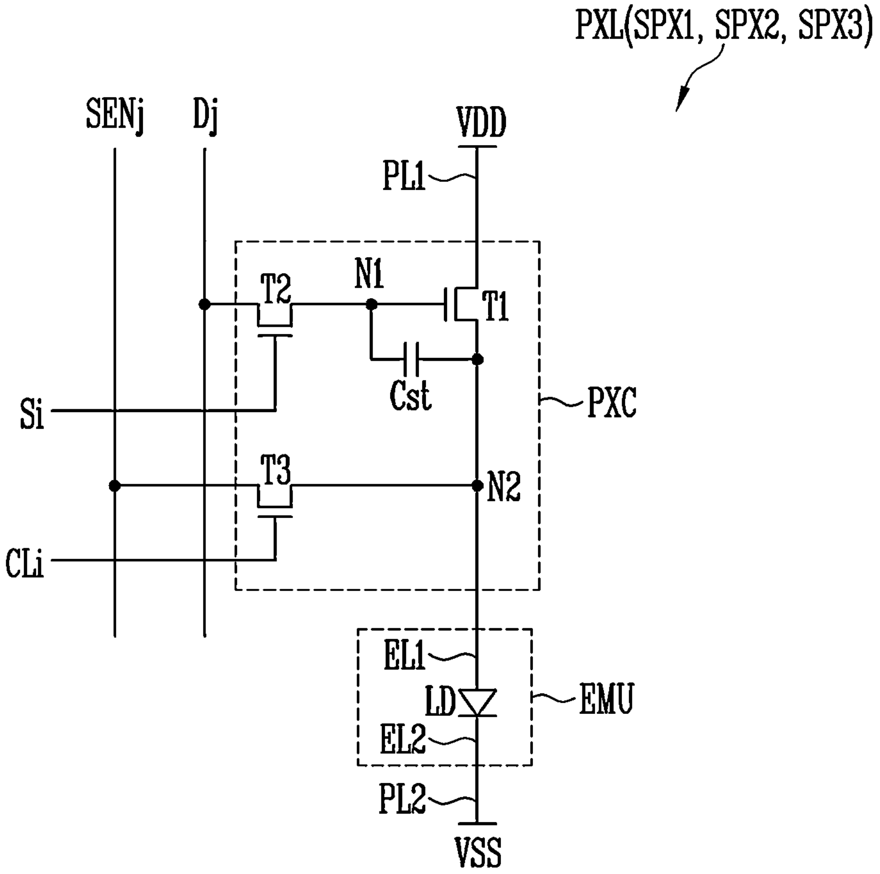
FIG. 5 is a schematic circuit diagram illustrating an electrical connection relationship of components included in each of pixels shown in FIG. 1 according to some embodiments of the present disclosure.

FIG. 5 is a schematic circuit diagram illustrating an electrical connection relationship of components included in each of the pixels PXL shown in FIG. 1.

For convenience of description, a pixel PXL located on an ith pixel row (or ith horizontal line) and a jth pixel column will be illustrated in FIG. 5 (i and j are natural numbers).

Referring to FIGS. 1 to 5, each of pixels PXL (or first, second, and third sub-pixels SPX1, SPX2, and SPX3) may include an emission component EMU which generates light with a luminance corresponding to a data signal and a pixel circuit PXC for driving the emission component EMU.

The light emission component EMU may include a light emitting element LD connected between a first power line PL1 supplied with a voltage of a first driving power source VDD and a second power line PL2 supplied with a voltage of a second driving power source VSS. For example, the emission component EMU may include a first electrode EL1 connected to the first driving power source VDD via the pixel circuit PXC and the first power line PL1 and a second electrode EL2 connected to the second driving power source VSS via the second power line PL2. The first electrode EL1 may be an anode, and the second electrode EL2 may be a cathode. A potential difference between the first driving power source VDD and the second driving power source VSS may be set equal to or higher than a threshold voltage of the light emitting element LD during an emission period of the pixel PXL.

In case that a pixel PXL (or one of first, second, and third sub-pixels SPX1, SPX2, and SPX3) is located on an ith pixel row and a jth pixel column in the display area DA, a pixel circuit PXC of the pixel PXL (or one of the first, second, and third sub-pixels SPX1, SPX2, and SPX3) may be electrically connected to an ith scan line Si and a jth data line Dj. Also, the pixel circuit PXC may be electrically connected to an ith control line CLi and a jth sensing line SENj.

1 The above-described pixel circuit PXC may include first to third transistors T1, T2, and T3 and a storage capacitor Cst.

The first transistor T1 is a driving transistor for controlling a driving current applied to the light emitting element LD, and may be electrically connected between the first driving power source VDD and the light emitting element LD. A first terminal of the first transistor T1 may be electrically connected to the first driving power source VDD through the first power line PL1, a second terminal of the first transistor T1 may be electrically connected to a second node N2, and a gate electrode of the first transistor T1 may be electrically connected to a first node N1. The first transistor T1 may control an amount of driving current applied from the first driving power source VDD to the light emitting element LD through the second node N2 according to a voltage applied to the first node N1. According to some embodiments, the first terminal of the first transistor T1 may be a drain electrode, and the second terminal of the first transistor T1 may be a source electrode. However, embodiments according to the present disclosure are not limited thereto. In some embodiments, the first terminal may be the source electrode, and the second terminal may be the drain electrode.

The second transistor T2 is a switching transistor which selects a pixel PXL in response to a scan signal and activates the pixel PXL, and may be electrically connected between the jth data line Dj and the first node N1. A first terminal of the second transistor T2 may be electrically connected to the data line Dj, a second terminal of the second transistor T2 may be electrically connected to the first node N1 (or the gate electrode of the first transistor T1), and a gate electrode of the second transistor T2 may be electrically connected to the ith scan line Si. The first terminal and the second terminal of the second transistor T2 are different terminals. For example, in case that the first terminal is a drain electrode, the second terminal may be a source electrode.

The second transistor T2 may be turned on in case that a scan signal having a gate-on voltage (e.g., a high level voltage) is supplied from the ith scan line Si, to electrically connect the jth data line Dj and the first node N1 to each other. The first node N1 is a point at which the second terminal of the second transistor T2 and the gate electrode of the first transistor T1 are connected to each other. The second transistor T2 may transfer a data signal to the gate electrode of the first transistor T1.

The third transistor T3 may electrically connect the first transistor T1 to the jth sensing line SENj, to acquire a sensing signal through the jth sensing line SENj, and detect a characteristic of the pixel PXL, including a threshold voltage of the first transistor T1, and the like, by using the sensing signal. Information on the characteristic of the pixel PXL may be used to convert image data such that a characteristic deviation between pixels PXL can be compensated. A first terminal of the third transistor T3 may be electrically connected to the jth sensing line SENj, a second terminal of the third transistor T3 may be electrically connected to the second terminal of the first transistor T1, and a gate electrode of the third transistor T3 may be electrically connected to the ith control line CLi. The first terminal may be a drain electrode, and the second terminal may be a source electrode.

The third transistor T3 is an initialization transistor capable of initializing the second node N2, and may be turned on in case that a sensing control signal is supplied from the ith control line CLi, to transfer a voltage of an initialization power source to the second node N2. Accordingly, the storage capacitor Cst electrically connected to the second node N2 can be initialized.

The storage capacitor Cst may include a first storage electrode and a second storage electrode. The first storage electrode may be electrically connected to the first node N1, and the second storage capacitor may be electrically connected to the second node N2. The storage capacitor Cst charges a data voltage corresponding to a data signal supplied to the first node N1 during one frame period. Accordingly, the storage capacitor Cst can store a voltage corresponding to a difference between a voltage of the gate electrode of the first transistor T1 and a voltage of the second node N2.

Although embodiments in which the first to third transistors T1, T2, and T3 are all N-type transistors have been disclosed in FIG. 5, embodiments according to the present disclosure are not limited thereto. For example, at least one of the above-described first to third transistors T1, T2, or T3 may be replaced with a P-type transistor.

The structure of the pixel circuit PXC may be variously modified and embodied. For example, the pixel circuit PXC may additionally further include at least one transistor element such as a transistor element for initializing the first node N1 and/or a transistor element for controlling an emission time of the light emitting elements LD, or other circuit elements such as a boosting capacitor for boosting a voltage of the first node N1. For example, the pixel circuit PXC may be configured to include five transistor elements and two capacitors. In some embodiments, the pixel circuit PXC may include seven transistor elements and two capacitors.

In the following embodiments, for convenience of description, a lateral direction (or X-axis direction) on a plane is indicated as a first direction DR1, a longitudinal direction (or Y-axis direction) on the plane is indicated as a second direction DR2, and a longitudinal direction on a section is indicated as a third direction DR3.

Figure 6:
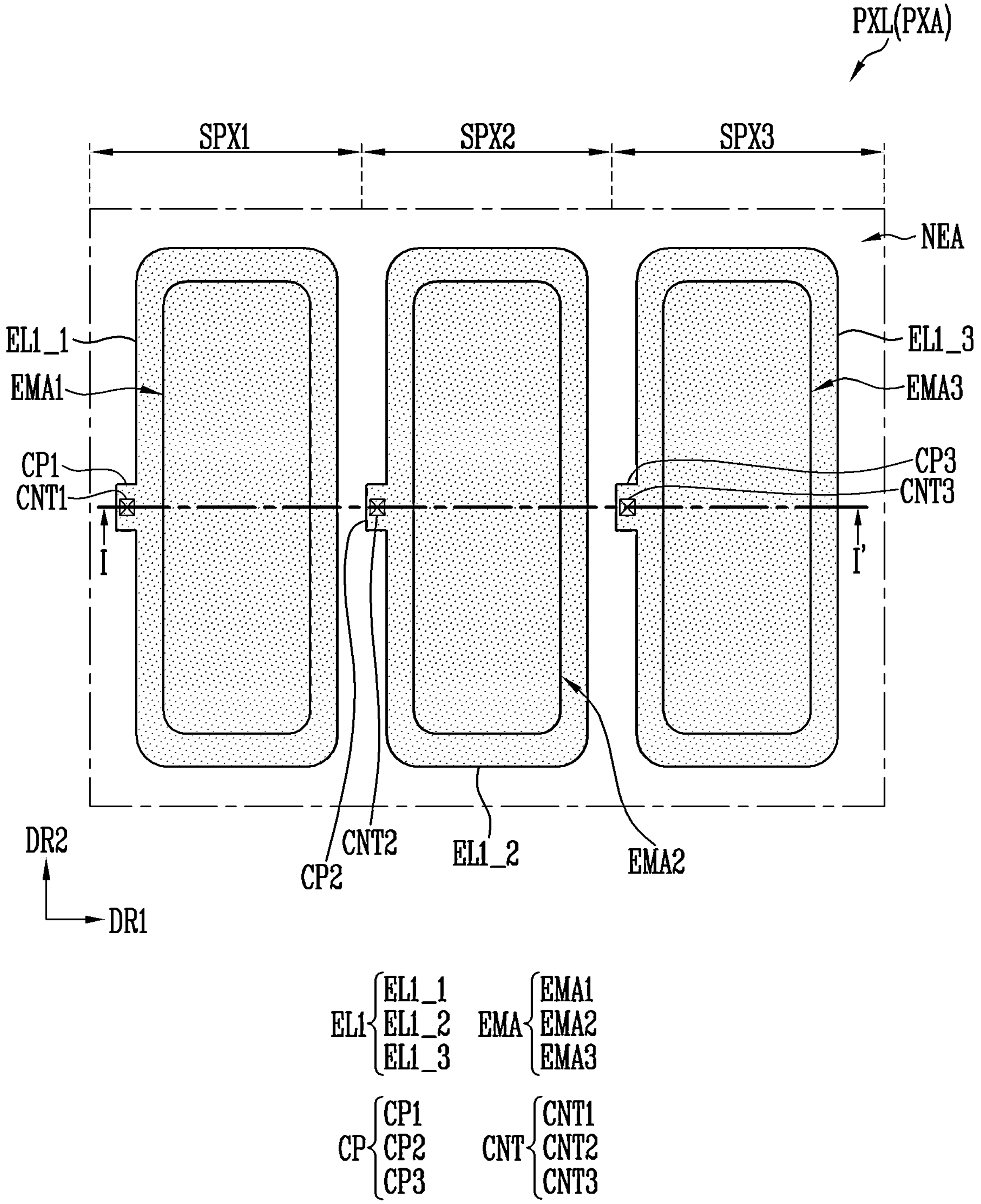
FIG. 6 is a schematic plan view illustrating a pixel according to some embodiments of the present disclosure.

FIG. 6 is a schematic plan view illustrating a pixel PXL according to some embodiments of the present disclosure.

In FIG. 6, the pixel PXL may include not only components included in the pixel PXL but also an area in which the components are provided (or located).

Referring to FIGS. 1 to 6, the pixel PXL may be located in a pixel area PXA provided in the display area DA. The pixel area PXA may include an emission area EMA and a non-emission area NEA.

The pixel PXL may include a first sub-pixel SPX1, a second sub-pixel SPX2, and a third sub-pixel SPX3.

The first sub-pixel SPX1 may include a first emission area EMA1 and the non-emission area NEA adjacent to the first emission area EMA1 (or surrounding at least one side of the first emission area EMA1). The second sub-pixel SPX2 may include a second emission area EMA2 and the non-emission area NEA adjacent to the second emission area EMA2 (or surrounding at least one side of the second emission area EMA2). The third sub-pixel SPX3 may include a third emission area EMA3 and the non-emission area NEA adjacent to the third emission area EMA3 (or surrounding at least one side of the third emission area EMA3). The first emission area EMA1, the second emission area EMA2, and the third emission area EMA3 may constitute the emission area EMA of the pixel PXL.

Each of the first, second, and third sub-pixels SPX1, SPX2, and SPX3 may include a light emitting element (see "LD" shown in FIG. 5) emitting light and circuit elements for driving the light emitting element LD. The first emission area EMA1 may an area in which light is emitted from a light emitting element LD driven by circuit elements of the first sub-pixel SPX1. The second emission area EMA2 may an area in which light is emitted from a light emitting element LD driven by circuit elements of the second sub-pixel SPX2. The third emission area EMA3 may an area in which light is emitted from a light emitting element LD driven by circuit elements of the third sub-pixel SPX3.

The light emitting element LD located in the first sub-pixel SPX1 may include a (1-1)th electrode EL1_1, a first light emitting layer (see "EML1" shown in FIG. 7) located on the (1-1)th electrode EL1_1, and a second electrode (see "EL2" shown in FIG. 7) located on the first light emitting layer EML1. The light emitting element LD located in the second sub-pixel SPX2 may include a (1-2)th electrode EL1_2, a second light emitting layer (see "EML2" shown in FIG. 7) located on the (1-2)th electrode EL1_2, and the second electrode EL2 located on the second light emitting layer EML2. The light emitting element LD located in the third sub-pixel SPX3 may include a (1-3)th electrode EL1_3, a third light emitting layer (see "EML3" shown in FIG. 7) located on the (1-3)th electrode EL1_3, and the second electrode EL2 located on the third light emitting layer EML3. The (1-1)th electrode EL1_1, the (1-2)th electrode EL1_2, and a (1-3)th electrode EL1_3 may constitute a first electrode EL1 of the pixel PXL.

According to some embodiments, the first electrode EL1 may be integrally formed with a conductive pattern CP of a pixel circuit (see "PXC" shown in FIG. 5). For example, the (1-1)th electrode EL1_1 may be integrally formed with a first conductive pattern CP1, the (1-2)th electrode EL1_2 may be integrally formed with a second conductive pattern CP2, and the (1-3)th electrode EL1_3 may be integrally formed with a third conductive pattern CP3.

Each of the first, second, and third conductive patterns CP1, CP2, and CP3 may be, for example, one of the second terminal of the first transistor T1, the second terminal of the third transistor T3, and the second capacitor electrode of the storage capacitor Cst, which are described with reference to FIG. 5, but embodiments according to the present disclosure are not limited thereto. That is, each of the first, second, and third conductive patterns CP1, CP2, and CP3 may be one of components of the pixel circuit PXC, which are electrically connected to the corresponding first electrode EL1.

In case that the first conductive pattern CP1 and the (1-1)th electrode EL1_1 are integrally formed, the first conductive pattern CP1 may be one area of the (1-1)th electrode EL1_1. In case that the second conductive pattern CP2 and the (1-2)th electrode EL1_2 are integrally formed, the second conductive pattern CP2 may be one area of the (1-2)th electrode EL1_2. In case that the third conductive pattern CP3 and the (1-3)th electrode EL1_3 are integrally formed, the third conductive pattern CP3 may be one area of the (1-3)th electrode EL1_3.

According to some embodiments, a conductive pattern CP of each sub-pixel may be electrically connected to a circuit element of the pixel circuit layer PCL described with reference to FIG. 4 through a contact part CNT. For example, the first conductive pattern CP1 may be electrically connected to a circuit element of the pixel circuit layer PCL of the first sub-pixel SPX1 through a first contact part CNT1, the second conductive pattern CP2 may be electrically connected to a circuit element of the pixel circuit layer PCL of the second sub-pixel SPX2 through a second contact part CNT2, and the third conductive pattern CP3 may be electrically connected to a circuit element of the pixel circuit layer PCL of the third sub-pixel SPX3 through a third contact part CNT3.

Hereinafter, a stacked structure (or sectional structure) of the pixel PXL in accordance with the above-described embodiments will be mainly described in detail with reference to FIGS. 7 to 13.

Figure 7:
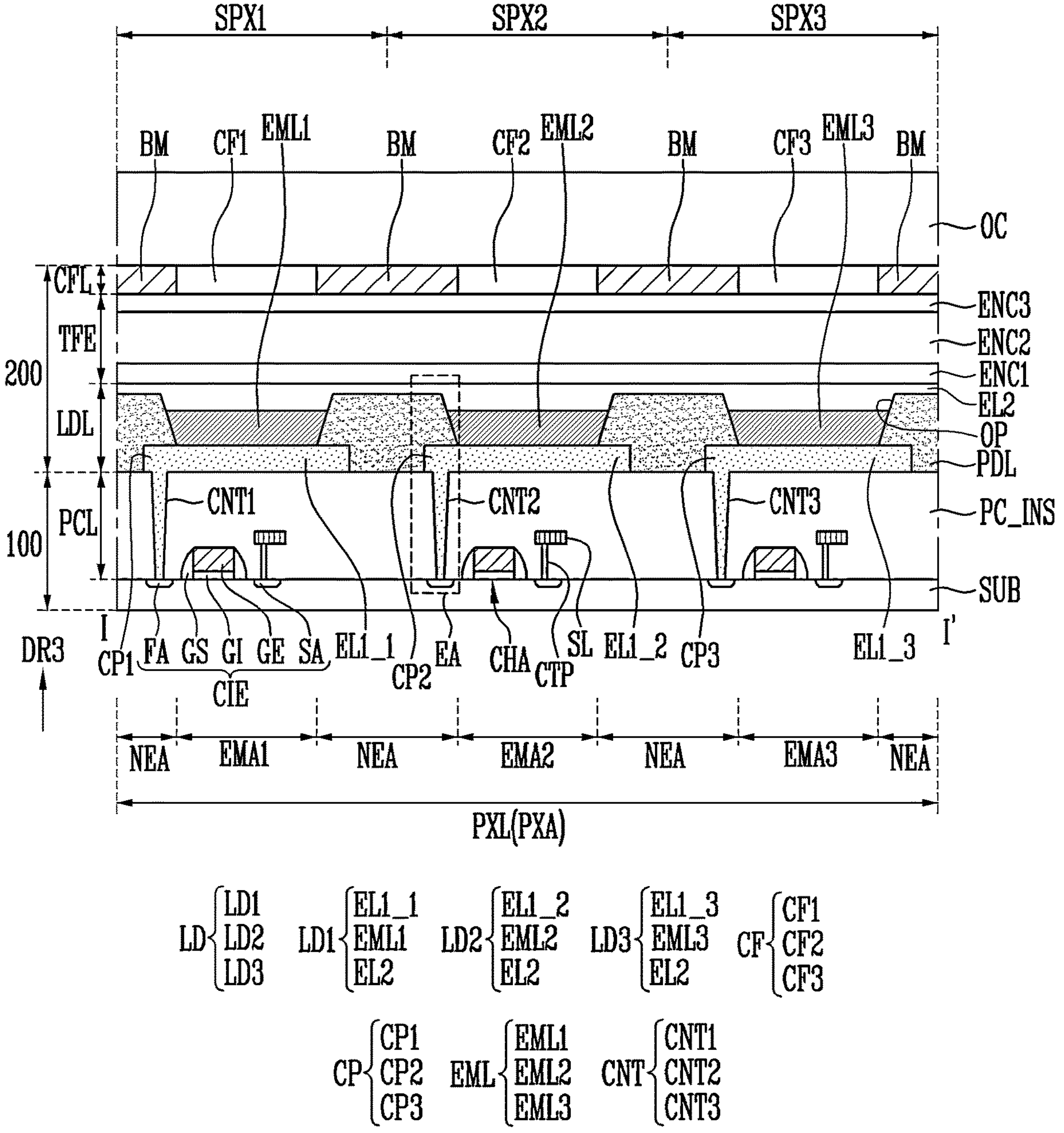
FIG. 7 is a schematic cross-sectional view taken along the line I-I' shown in FIG. 6 according to some embodiments of the present disclosure.
Figure 8:
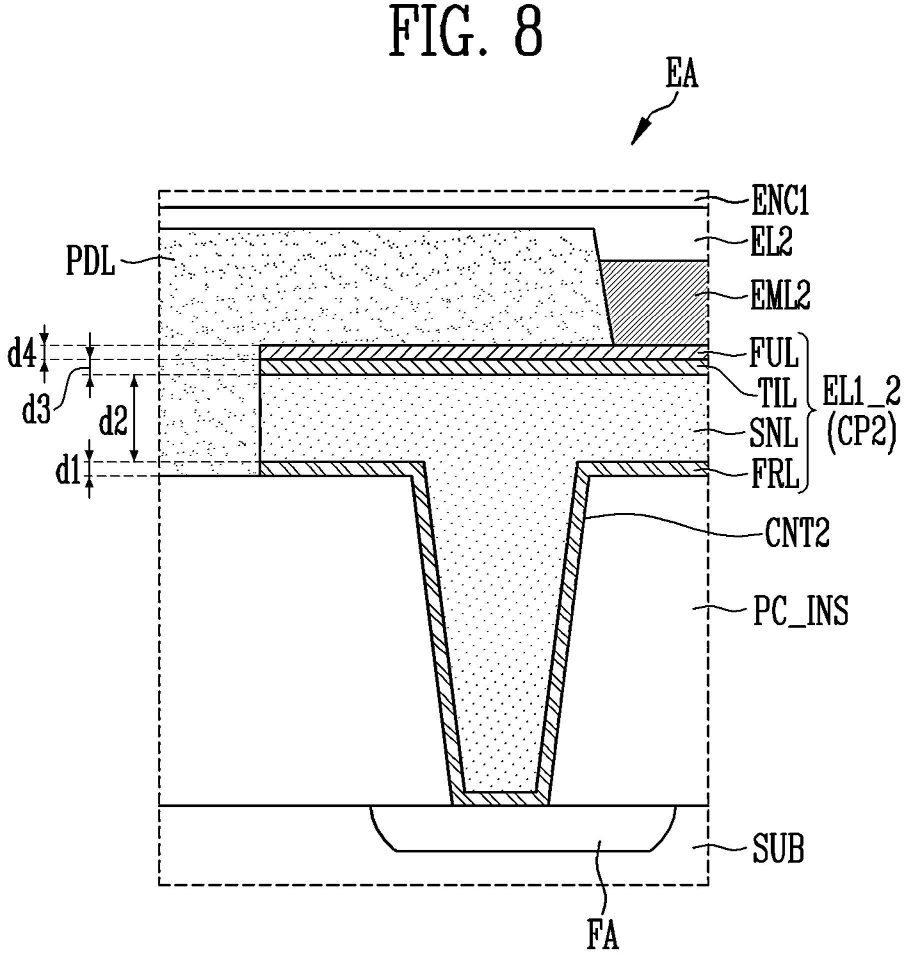
FIGS. 8 and 9 are schematic enlarged views illustrating portion EA shown in FIG. 7 according to some embodiments of the present disclosure.
Figure 9:
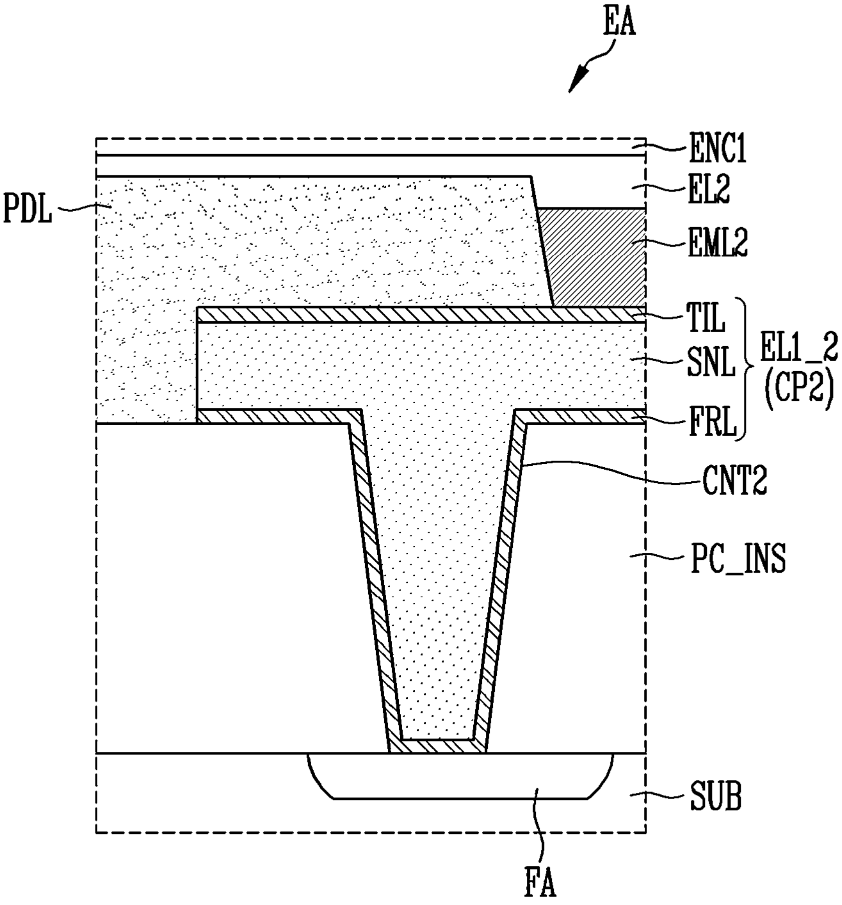
Figure 10:
FIG. 10 is a view illustrating annealing results of comparative examples and aspects of some embodiments.
Figure 10:
Figure 10:
Figure 10:
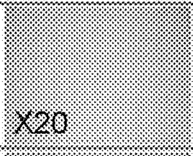
Figure 10:
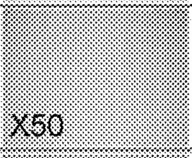
Figure 10:
Figure 10:
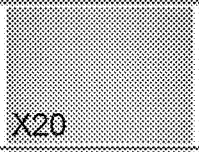
Figure 10:
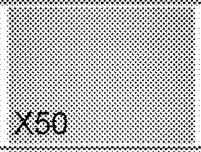
Figure 10:
Figure 10:
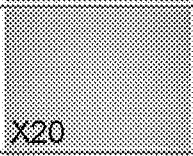
Figure 10:
Figure 10:
Figure 10:
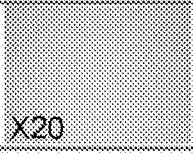
Figure 10:
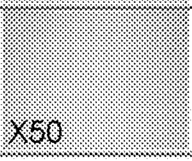
Figure 10:
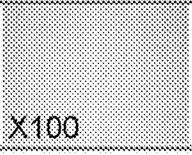
Figure 11:
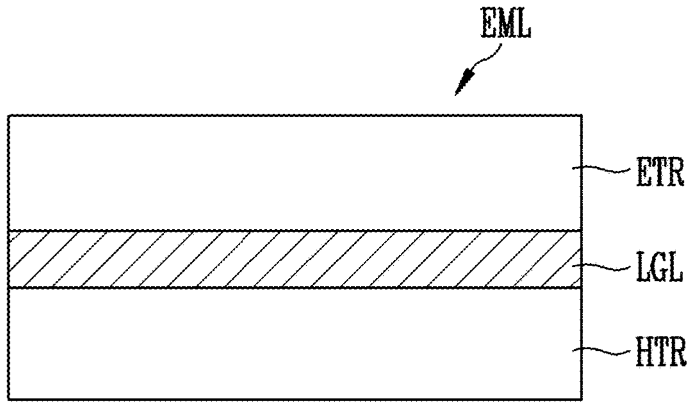
FIGS. 11 to 13 are schematic views illustrating various embodiments of a light emitting layer shown in FIG. 7.
Figure 12:
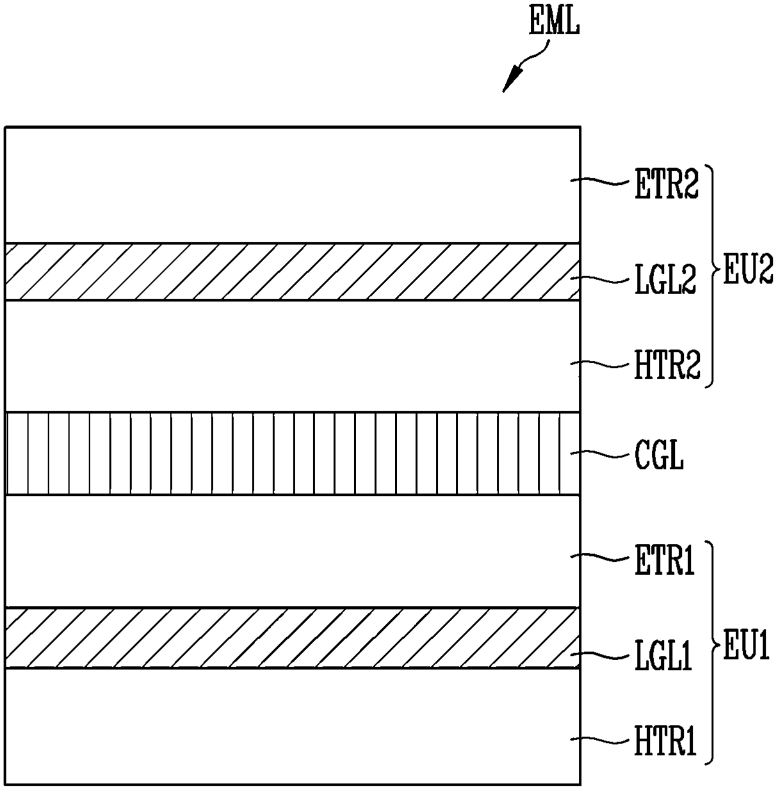
Figure 13:
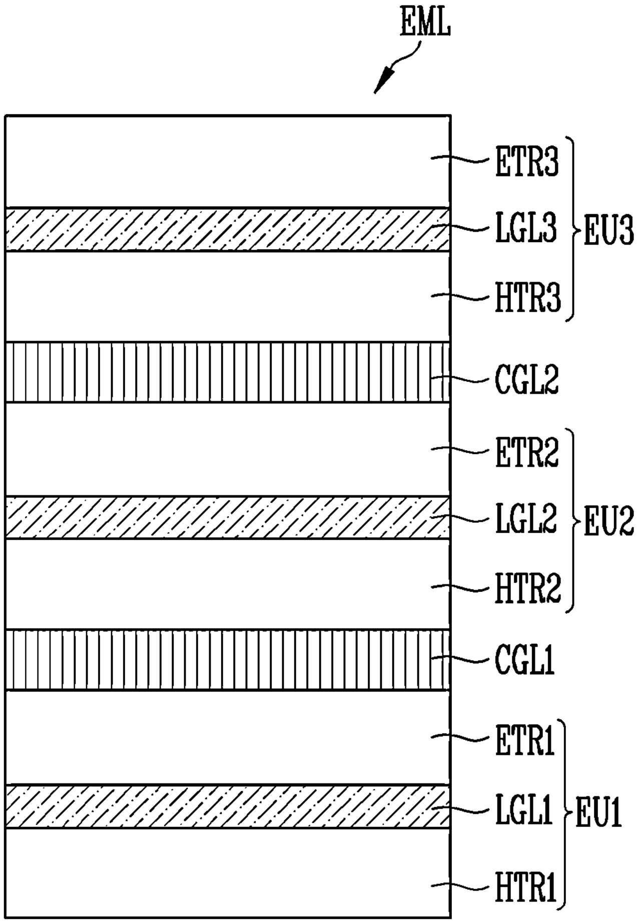

FIG. 7 is a schematic cross-sectional view taken along line I-I' shown in FIG. 6. FIGS. 8 and 9 are schematic enlarged views illustrating portion EA shown in FIG. 7. FIG. 10 is a view illustrating annealing results of comparative examples and some embodiments. FIGS. 11 to 13 are schematic views illustrating various embodiments of the light emitting layer EML shown in FIG. 7.

In relation to embodiments shown in FIGS. 7 to 13, portions different from those of the above-described embodiments will be mainly described to avoid redundancy.

Referring to FIGS. 1 to 13, the pixel PXL according to some embodiments of the present disclosure may include a first sub-pixel SPX1, a second sub-pixel SPX2, and a third sub-pixel SPX3.

Each of the first, second, and third sub-pixels SPX1, SPX2, and SPX3 may include a circuit board 100, a display element layer 200, and an overcoat layer OC.

The circuit board 100 may include a substrate SUB and a pixel circuit layer PCL.

The substrate SUB may include a silicon wafer substrate formed using a semiconductor process. The substrate SUB may include a semiconductor material, e.g., a Group IV semiconductor, a Group III-V compound semiconductor, or a Group II-VI compound semiconductor. For example, the Group IV semiconductor may include silicon, germanium, or silicon-germanium. The substrate SUB may be provided as a bulk wafer, an epitaxial layer, a Silicon On Insulator (SOI) layer, a Semiconductor On Insulator (SeOI) layer, or the like.

The pixel circuit layer PCL may include circuit elements CIE, a circuit insulating layer PC_INS, mutual connection parts CTP, and circuit lines SL.

The circuit element CIE may include a transistor formed on the substrate SUB. The circuit element CIE may include a gate insulating layer GI, a gate electrode GE, and a gate spacer GS. First and second regions FA and SA may be located in the substrate SUB at both sides of the gate electrode GE. One of the first and second regions FA and SA may be a source region, and the other of the first and second regions FA and SA may be a drain region. According to some embodiments, the first region FA may be the source region, and the second region SA may be the drain region.

The gate insulating layer GI may be located on the substrate SUB. The gate insulating layer GI may include oxide, nitride, or a high dielectric constant (high-k) material. The high dielectric constant material may mean a dielectric material having a dielectric constant higher than a dielectric constant of silicon oxide ($SiO_x$). For example, the high dielectric constant material may be any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide (HfSixOy), lanthanum oxide (La2O3), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$), but embodiments according to the present disclosure are not limited thereto.

The gate electrode GE may be located on the gate insulating layer GI. The gate electrode GE may include a conductive material. The conductive material may include, for example, a metal nitride such as titanium nitride (TiN), tantalum nitride (TaN), or tungsten nitride (WN), and/or a metal material such as aluminum (Al), tungsten (W), copper (Cu) or molybdenum (Mo), or a semiconductor material such as doped poly-silicon. The gate electrode GE may be configured as a single layer or be configured as a multi-layer including at least two layers.

The gate spacer GS may be located at both sides of the gate electrode GE, and insulate the first and second regions FA and SA and the gate electrode GE from each other. In some embodiments, the gate spacer GS may be provided in a multi-layer structure. The gate space GS may be made of oxide, nitride, and oxynitride. For example, the gate spacer GS may be formed of a low dielectric constant layer.

The first and second regions FA and SA may be located in the substrate SUB at both sides of the gate electrode GE. The first and second regions FA and SA may correspond to a semiconductor layer including silicon, and include different kinds and/or different concentrations of impurities.

A channel region CHA may be located under the gate electrode GE in the substrate SUB. The channel region CHA may be connected to the first and second regions FA and SA. The channel region CHA may be made of a semiconductor material, and include, for example, at least one of silicon, silicon germanium, or germanium.

The mutual connection part CTP may be in contact with the first and second regions FA and SA while recessing the first and second regions FA and SA, and be located to be in contact with a corresponding region among the first and second regions FA and SA along a top surface of the corresponding region. However, embodiments according to the present disclosure are not limited thereto. The contact plugs CTP may include, for example, a metal nitride such as titanium nitride (TiN), tantalum nitride (TaN), or tungsten nitride (WN), and/or a metal material such as aluminum (Al), tungsten (W), copper (Cu) or molybdenum (Mo), but embodiments according to the present disclosure are not limited thereto.

The circuit insulating layer PC_INS (or interlayer insulating layer) may be located over the circuit elements CIE on the substrate SUB. The mutual connection part CTP may be electrically connected to the first and second regions FA and SA while penetrating the circuit insulating layer PC_INS. The gate electrode GE and the mutual connection part CTP may be electrically connected to each other. The circuit lines SL may be electrically connected to the mutual connection parts CTP, and be located in a plurality of layers.

The pixel circuit layer PCL may further include scan lines and data lines arranged to intersect the scan lines. The scan lines may be supplied with a scan signal through a scan driver (see "SDV" shown in FIG. 2), and the data lines may be supplied with data voltages through a data driver (see "DDV" shown in FIG. 2).

The transistor which the circuit element CIE constitutes may be electrically connected to a conductive pattern CP of a corresponding sub-pixel through a contact part CNT penetrating the circuit insulating layer PC_INS. For example, the transistor which the circuit element CIE constitutes in the first sub-pixel SPX1 may be electrically connected to a first conductive pattern CP1 through a first contact part CNT1 penetrating the circuit insulating layer PC_INS, the transistor which the circuit element CIE constitutes in the second sub-pixel SPX2 may be electrically connected to a second conductive pattern CP2 through a second contact part CNT2 penetrating the circuit insulating layer PC_INS, and the transistor which the circuit element CIE constitutes in the third sub-pixel SPX3 may be electrically connected to a third conductive pattern CP3 through a third contact part CNT3 penetrating the circuit insulating layer PC_INS.

The circuit insulating layer PC_INS may cover the circuit elements CIE and the circuit lines SL, and have a uniform (or flat) surface through a planarization process such as a CMP process.

The display element layer 200 may be located on the pixel circuit layer PCL. The display element layer 200 may include a light emitting element layer LDL, a thin film encapsulation layer TFE, and a color filter layer CFL, which are formed using a display process.

The light emitting element layer LDL may include a light emitting element LD and a pixel defining layer PDL. The light emitting element LD may include a first light emitting element LD1 located in the first sub-pixel SPX1, a second light emitting element LD2 located in the second sub-pixel SPX2, and a third light emitting element LD3 located in the third sub-pixel SPX3.

The first light emitting element LD1 may include a (1-1)th electrode EL1_1, a first light emitting layer EML1, and a second electrode EL2. The second light emitting element LD2 may include a (1-2)th electrode EL1_2, a second light emitting layer EML2, and the second electrode EL2. The third light emitting element LD3 may include a (1-3)th electrode EL1_3, a third light emitting layer EML3, and the second electrode EL2.

Each of the (1-1)th electrode EL1_1, the (1-2)th electrode EL1_2, and the (1-3)th electrode EL1_3 may be provided and/or formed on the circuit insulating layer PC_INS of a corresponding sub-pixel. For example, the (1-1)th electrode EL1_1, the (1-2)th electrode EL1_2, and the (1-3)th electrode EL1_3 may be provided and/or formed on the circuit insulating layer PC_INS having a flat surface through a photolithography process using a mask. The (1-1)th electrode EL1_1, the (1-2)th electrode EL1_2, and the (1-3)th electrode EL1_3 may be located on the circuit insulating layer PC_INS to be spaced apart from each other. The (1-1)th electrode EL1_1 may be an anode of the first light emitting element LD1, the (1-2)th electrode EL1_2 may be an anode of the second light emitting element LD2, and the (1-3)th electrode EL1_3 may be an anode of the third light emitting element LD3.

The (1-1)th electrode EL1_1 may be integrally formed with the first conductive pattern CP1. The first conductive pattern CP1 may include at least one of the second terminal of the first transistor T1, the second terminal of the third transistor T3, or the second storage electrode of the storage capacitor Cst, which are described with reference to FIG. 5. For example, the first conductive pattern CP1 may be a source electrode as the second terminal of the first transistor T1 of the first sub-pixel SPX1.

The first conductive pattern CP1 may be electrically connected to the circuit element CIE of the pixel circuit layer PCL of the first sub-pixel SPX1 through the first contact part CNT1 penetrating the circuit insulating layer PC_INS. The first conductive pattern CP1 may be connected to the first region FA of the circuit element CIE while being in direct contact with the first region FA through the first contact part CNT1.

The (1-2)th electrode EL1_2 may be integrally formed with the second conductive pattern CP2. The second conductive pattern CP2 may include at least one of the second terminal of the first transistor T1, the second terminal of the third transistor T3, or the second storage electrode of the storage capacitor Cst, which are described with reference to FIG. 5. For example, the second conductive pattern CP2 may be a source electrode as the second terminal of the first transistor T1 of the second sub-pixel SPX2.

The second conductive pattern CP2 may be electrically connected to the circuit element CIE of the pixel circuit layer PCL of the second sub-pixel SPX2 through the second contact part CNT2 penetrating the circuit insulating layer PC_INS. The second conductive pattern CP2 may be connected to the first region FA of the circuit element CIE while being in direct contact with the first region FA through the second contact part CNT2.

The (1-3)th electrode EL1_3 may be integrally formed with the third conductive pattern CP3. The third conductive pattern CP3 may include at least one of the second terminal of the first transistor T1, the second terminal of the third transistor T3, or the second storage electrode of the storage capacitor Cst, which are described with reference to FIG. 5. For example, the third conductive pattern CP3 may be a source electrode as the second terminal of the first transistor T1 of the third sub-pixel SPX3.

The third conductive pattern CP3 may be electrically connected to the circuit element CIE of the pixel circuit layer PCL of the third sub-pixel SPX3 through the third contact part CNT3 penetrating the circuit insulating layer PC_INS. The third conductive pattern CP3 may be connected to the first region FA of the circuit element CIE while being in direct contact with the first region FA through the third contact part CNT3.

As described above, the conductive pattern CP and a first electrode EL1, which are integrally formed, may be configured as a first conductive layer (e.g., a source-drain layer) located on the circuit insulating layer PC_INS. The conductive pattern CP and the first electrode EL1 may be formed through the same process to include the same material and to be located in the same layer. For example, the first conductive pattern CP1 and the (1-1)th electrode EL1_1 may be formed through the same process to include the same material and to be located in the same layer. The second conductive pattern CP2 and the (1-2)th electrode EL1_2 may be formed through the same process to include the same material and to be located in the same layer. The third conductive pattern CP3 and the (1-3)th electrode EL1_3 may be formed through the same process to include the same material and to be located in the same layer.

Each of the (1-1)th electrode EL1_1, the (1-2)th electrode EL1_2, and the (1-3)th electrode EL1_3 may be configured with a material having a reflectivity (or predetermined reflectivity) to allow light emitted from a corresponding light emitting layer EML to advance in the image display direction. For example, the (1-1)th electrode EL1_1, the (1-2)th electrode EL1_2, and the (1-3)th electrode EL1_3 may be configured with a conductive material (or substance). The conductive material may include an opaque metal suitable for reflecting light emitted from the light emitting layer EML in the image display direction (or an upper direction of the display element layer 200). The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. However, the material of the (1-1)th electrode EL1_1, the (1-2)th electrode EL1_2, and the (1-3)th electrode EL1_3 is not limited to the above-described embodiments. In some embodiments, the (1-1)th electrode EL1_1, the (1-2)th electrode EL1_2, and the (1-3)th electrode EL1_3 may include a transparent conductive material. The transparent conductive material may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as poly(3,4-ethylenedioxythiophene (PEDOT), and the like. In case that the (1-1)th electrode EL1_1, the (1-2)th electrode EL1_2, and the (1-3)th electrode EL1_3 include a transparent conductive material, a separate conductive layer may be added, which is made of an opaque metal for reflecting light emitted from a corresponding light emitting layer EML in the image display direction. However, the material of the (1-1)th electrode EL1_1, the (1-2)th electrode EL1_2, and the (1-3)th electrode EL1_3 is not limited to the above-described materials.

According to some embodiments, each of the (1-1)th electrode EL1_1, the (1-2)th electrode EL1_2, and the (1-3)th electrode EL1_3 may be provided and/or formed as a multi-layer in which at least two materials among metals, alloys, conductive oxide, and conductive polymers are stacked. For example, each of the (1-1)th electrode EL1_1, the (1-2)th electrode EL1_2, and the (1-3)th electrode EL1_3 may be provided and/or formed as a quadruple layer including a first layer FRL, a second layer SNL, a third layer TIL, and a fourth layer FUL, which are sequentially stacked in an upper direction from a top surface of the circuit insulating layer PC_INS as shown in FIG. 8.

In each of the (1-1)th electrode EL1_1, the (1-2)th electrode EL1_2, and the (1-3)th electrode EL1_3, the second layer SNL may be used as a reflective layer (or reflective member) which reflects light emitted from a corresponding light emitting layer EML in the image display direction. For example, the second layer SNL in the (1-1)th electrode EL1_1 may be used as a reflective layer which reflects light emitted from the first light emitting layer EML1 in the image display direction, the second layer SNL in the (1-2)th electrode EL1_2 may be used as a reflective layer which reflects light emitted from the second light emitting layer EML2 in the image display direction, and the second layer SNL in the (1-3)th electrode EL1_3 may be used as a reflective layer which reflects light emitted from the third light emitting layer EML3 in the image display direction.

According to some embodiments, the second layer SNL may include an opaque metal such as an aluminum alloy. For example, the second layer SNL may include an aluminum-nickel-lanthanum-based alloy configured with aluminum of 99.94 at %, nickel of 0.02 at %, and lanthanum of 0.04 at %. A content of the nickel and the lanthanum in the second layer SNL may be less than 0.1 at %.

The second layer SNL may have a thickness d2 of about 2000 Å to about 6000 Å, but embodiments according to the present disclosure are not limited thereto. The second layer SNL may have the thickness d2 thicker than a thickness of each of the first layer FRL, the third layer TIL, and the fourth layer FUL. As the second layer SNL has the thickness d2 thicker than a thickness of each of the first layer FRL, the third layer TIL, and the fourth layer FUL, each of the first conductive pattern CP1 integrally formed with the (1-1)th electrode EL1_1, the second conductive pattern CP2 integrally formed with the (1-2)th electrode EL1_2, and the third conductive pattern CP3 integrally formed with the (1-3)th electrode EL1_3 can be used as a reflective layer which reflects light emitted from a corresponding light emitting layer EML while being used as a line having a low resistance.

Results in vacuum annealing will be described with reference to FIG. 10 by classifying an aluminum-nickel-lanthanum-based alloy layer (e.g., an embodiment) configured with aluminum of 99.94 at %, nickel of 0.02 at %, and lanthanum of 0.04 at % and layers (e.g., comparative examples) configured with pure aluminum. The vacuum annealing was performed under a film formation pressure of 0.3 Pa and an argon gas atmosphere of 150 sccm.

In FIG. 10, comparative example 1 is a result of a pure aluminum layer having a thickness of 1000 Å, on which the vacuum annealing is performed at 250° C. for 30 minutes, comparative example 2 is a result of a pure aluminum layer having a thickness of 1000 Å, on which the vacuum annealing is performed at 230° C. for 30 minutes, comparative example 3 is a result of a pure aluminum layer having a thickness of 1000 Å, on which the vacuum annealing is performed at 210° C. for 30 minutes, and comparative example 4 is a result of a pure aluminum layer having a thickness of 1000 Å, on which the vacuum annealing is performed at 180° C. for 10 minutes. The embodiments are a result of an aluminum-nickel-lanthanum-based alloy layer configured with aluminum of 99.94 at %, nickel of 0.02 at %, and lanthanum of 0.04 at %, which has a thickness of 1000 Å. The vacuum annealing is performed on the aluminum-nickel-lanthanum-based alloy layer at 250° C. for 30 minutes.

In the comparative example 1, the comparative example 2, the comparative example 3, and the comparative example 4, it can be seen that, as a tensile or compressive stress is applied while annealing is performed, hillock occurs due to a material characteristic of aluminum. The hillock results from uneven thicknesses of upper layers in a subsequent manufacturing process, and therefore, the step coverage of the upper layers may be deteriorated.

According to some embodiments of the present disclosure in which an aluminum thin film of 99.94 at % is doped with nickel of 0.02 at % and lanthanum of 0.04 at %, it can be seen that no hillock occur while annealing is performed. Such an aluminum-nickel-lanthanum-based alloy layer may become a hillock-free layer. As the second layer SNL becomes a hillock-free layer, the step coverage of the third layer TIL and the fourth layer FUL, which are stacked on the top of the second layer SNL, can be improved.

According to some embodiments, the first layer FRL may be a barrier layer (or barrier metal layer) provided to prevent or reduce instances of a failure (e.g., a junction breakdown phenomenon) which may occur in case that the second layer SNL including an aluminum-nickel-lanthanum-based alloy and the first region FA configured with a semiconductor layer including silicon are in direct contact with each other. The first layer FRL may be configured with titanium (Ti) to improve a contact characteristic with the first region FA configured with the semiconductor layer including silicon. The first layer FRL may have a thickness d1 of about 400 Å to about 600 Å, but embodiments according to the present disclosure are not limited thereto.

In each of the (1-1)th electrode EL1_1 (or the first conductive pattern CP1), the (1-2)th electrode EL1_2 (or the second conductive pattern CP2), and the (1-3)th electrode EL1_3 (or the third conductive pattern CP3), the first layer FRL may be connected to a first region FA of a circuit element CIE while being in direct contact with the first region FA through a corresponding contact part CNT. For example, the first layer FRL of the (1-1)th electrode EL1_1 (or the first conductive pattern CP1) may be connected to a first region FA of a corresponding circuit element CIE while being in direct contact with the first region FA through the first contact part CNT1. The first layer FRL of the (1-2)th electrode EL1_2 (or the second conductive pattern CP2) may be connected to a first region FA of a corresponding circuit element CIE while being in direct contact with the first region FA through the second contact part CNT2. The first layer FRL of the (1-3)th electrode EL1_3 (or the third conductive pattern CP3) may be connected to a first region FA of a corresponding circuit element CIE while being in direct contact with the first region FA through the third contact part CNT3.

The fourth layer FUL may include a transparent conductive material. For example, the fourth layer FUL may include indium tin oxide, thereby being used as a hole injection layer which injects holes into a corresponding light emitting layer EML. The fourth layer FUL may have a thickness d4 of about 30 Å to about 100 Å. The fourth layer FUL may be formed to have the thickness d4 relatively thinner than a thickness of each of the first to third layers FRL, SNL, and TIL so as to reduce a burden on an etching process performed in a process of forming the (1-1)th electrode EL1_1, the (1-2)th electrode EL1_2, and the (1-3)th electrode EL1_3. However, embodiments according to the present disclosure are not limited thereto. The fourth layer FUL may have the thickness d4 thinner than the thickness of the second layer SNL. In some embodiments, the fourth layer FUL may have the thickness d4 substantially equal or similar to a thickness of each of the first and third layers SNL and TIL.

The third layer TIL is provided to prevent or reduce instances of a failure due to a material characteristic which may occur in case that the second layer SNL including an aluminum-nickel-lanthanum-based alloy and the fourth layer FUL including indium tin oxide are in direct contact with each other, and may include tungsten oxide ($WO_x$). The third layer TIL may have a thickness d3 of about 30 Å to about 100 Å, but embodiments according to the present disclosure are not limited thereto. The third layer TIL may have the thickness d3 substantially equal or similar to the thickness of the fourth layer FUL.

The second layer SNL may have a resistance relatively larger than a resistance of each of the first layer FRL, the third layer TIL, and the fourth layer FUL due to the material characteristic and/or the thick thickness d3. As the third layer TIL is located between the second layer SNL and the fourth layer FUL, the second layer SNL and the fourth layer FUL are not in contact with each other, and hence a contact resistance of the fourth layer FUL may not increase. Therefore, the third layer TIL may be an ohmic contact layer located between the second layer SNL and the fourth layer FUL, thereby reducing a resistance between the second layer SNL and the fourth layer FUL.

In the above-described embodiments, it has been described that each of the (1-1)th electrode EL1_1 (or the first conductive pattern CP1), the (1-2)th electrode EL1_2 (or the second conductive pattern CP2), and the (1-3)th electrode EL1_3 (or the third conductive pattern CP3) is configured as a quadruple layer including the first layer FRL, the second layer SNL, the third layer TIL, and the fourth layer FUL, which are sequentially stacked. However, embodiments according to the present disclosure are not limited thereto. In some embodiments, each of the (1-1)th electrode EL1_1 (or the first conductive pattern CP1), the (1-2)th electrode EL1_2 (or the second conductive pattern CP2), and the (1-3)th electrode EL1_3 (or the third conductive pattern CP3) may be configured as a triple layer including the first layer FRL, the second layer SNL, and the third layer TIL, which are sequentially stacked on the circuit insulating layer PC_INS as shown in FIG. 9. The fourth layer FUL including indium tin oxide may be omitted, and the third layer TIL including tungsten oxide may be located immediately on the bottom of each of the first light emitting layer EML1, the second light emitting layer EML2, and the third light emitting layer EML3.

As described above, the pixel defining layer PDL on the (1-1)th electrode EL1_1, the first conductive pattern CP1, the (1-2)th electrode EL1_2, the second conductive pattern CP2, the (1-3)th electrode EL1_3, and the third conductive pattern CP3, including the first layer FRL, the second layer SNL, the third layer TIL, and the fourth layer FUL, which are sequentially stacked on the circuit insulating layer PC_INS along the third direction DR3.

The pixel defining layer PDL may be a structure which is located in a non-emission area NEA and defines an emission area EMA of the pixel PXL. For example, the pixel defining layer PDL may be a structure which is located on the circuit insulating layer PC_INS in the non-emission area NEA, defines a first emission area EMA1 of the first sub-pixel SPX1, defines a second emission area EMA2 of the second sub-pixel SPX2, and defines a third emission area EMA3 of the third sub-pixel SPX3.

The pixel defining layer PDL may be partially opened to include one opening OP exposing one area of the (1-1)th electrode EL1_1 in at least the first emission area EMA1, another opening OP exposing one area of the (1-2)th electrode EL1_2 in at least the second emission area EMA2, and still another opening OP exposing one area of the (1-3)th electrode EL1_3 in at least the third emission area EMA3.

The pixel defining layer PDL may be configured as an organic insulating layer including an organic material. The organic material may include acrylic resin, epoxy resin, phenolic resin, polyamide resin, polyimide resin, and the like. In some embodiments, the pixel defining layer PDL may include a light absorption material or have a light absorber coated thereon, to absorb light introduced from the outside. For example, the pixel defining layer PDL may include a carbon-based black pigment. However, embodiments according to the present disclosure are not limited thereto.

The pixel defining layer PDL may protrude in the third direction DR3 from a surface (or top surface) of the circuit insulating layer PC_INS.

The first light emitting layer EML1 may be located on the (1-1)th electrode EL1_1 exposed by the one opening OP of the pixel defining layer PDL, the second light emitting layer EML2 may be located on the (1-2)th electrode EL1_2 exposed by the another opening OP of the pixel defining layer PDL, and the third light emitting layer EML3 may be located on the (1-3)th electrode EL1_3 exposed by the still another opening OP of the pixel defining layer PDL. The first light emitting layer EML1, the second light emitting layer EML2, and the third light emitting layer EML3 may emit light of the same color. For example, the first, second, and third light emitting layers EML1, EML2, and EML3 may emit light of white.

The first, second, and third light emitting layers EML1, EML2, and EML3 may constitute a light emitting layer EML of the pixel PXL. The light emitting layer EML may have a single light emitting structure, a two-stack tandem light emitting structure, a three-stack tandem light emitting structure, and the like.

The light emitting layer EML having the single light emitting structure may include a light generation layer LGL, an electron transport region ETR, and a hole transport region HTR as shown in FIG. 11. The light generation layer LGL may be located between the electron transport region ETR and the hole transport region HTR. The electron transport region ETR may be electrically connected to the second electrode EL2, and the hole transport region HTR may be electrically connected to the first electrode EL1.

The light emitting layer EML having the two-stack tandem light emitting structure may include a plurality of light emitting structure part as shown in FIG. 12. For example, the light emitting layer EML having the two-stack tandem light emitting structure may include a first light emitting structure part EU1 adjacent to the first electrode EL1 and a second light emitting structure part EU2 adjacent to the second electrode EL2.

Each of the first and second light emitting structure parts EU1 and EU2 may include a light generation layer which generates light according to a current applied thereto. The first light emitting structure part EU1 may include a first light generation layer LGL1, a first electron transport region ETR1, and a first hole transport region HTR1. The first light generation layer LGL1 may be located between the first electron transport region ETR1 and the first hole transport region HTR1. The second light emitting structure part EU2 may include a second light generation layer LGL2, a second electron transport region ETR2, and a second hole transport region HTR2. The second light generation layer LGL2 may be located between the second electron transport region ETR2 and the second hole transport region HTR2.

Each of the first hole transport region HTR1 and the second hole transport region HTR2 may include at least one of a hole injection layer or a hole transport layer, and further include a hole buffer layer, an electron support layer, and the like, if necessary. The first hole transport region HTR1 and the second hole transport region HTR2 may have the same configuration or different configurations.

Each of the first electron transport region ETR1 and the second electron transport region ETR2 may include at least one of an electron injection layer or an electron transport layer, and further include an electron buffer layer, a hole support layer, and the like, if necessary. The first electron transport region ETR1 and the second electron transport region ETR2 may have the same configuration or different configurations.

A connection layer CGL may be located between the first light emitting structure part EU1 and the second light emitting structure part EU2.

For example, the connection layer CGL may have a stacked structure of a p-dopant layer and an n-dopant layer. For example, the p-dopant layer may include a p-type dopant such as HAT-CN, TCNQ or NDP-9, and the n-dopant layer may include an alkali metal, an alkali earth metal, a lanthanide-based metal, or any combination thereof.

The first light generation layer LGL1 and the second light generation layer LGL2 may generate light of the same color, but embodiments according to the present disclosure are not limited thereto. In some embodiments, the first light generation layer LGL1 and the second light generation layer LGL2 may generate lights of different colors. Lights respectively emitted from the first light generation layer LGL1 and the second light generation layer LGL2 may be mixed to generate white light. For example, the first light generation layer LGL1 may generate blue light, and the second light generation layer LGL2 may generate yellow light.

The light emitting layer EML having the three-stack tandem light emitting structure may include a first light emitting structure part EU1, a second light emitting structure part EU2, and a third light emitting structure part EU3 as shown in FIG. 13.

Each of the first, second, and third light emitting structure parts EU1, EU2, and EU3 may include a light generation layer which generates light according to a current applied thereto. For example, the first light emitting structure part EU1 may include a first light generation layer LGL1, a first electron transport region ETR1, and a first hole transport region HTR1. The first light generation layer LGL1 may be located between the first electron transport region ETR1 and the first hole transport region HTR1. The second light emitting structure part EU2 may include a second light generation layer LGL2, a second electron transport region ETR2, and a second hole transport region HTR2. The second light generation layer LGL2 may be located between the second electron transport region ETR2 and the second hole transport region HTR2. The third light emitting structure part EU3 may include a third light generation layer LGL3, a third electron transport region ETR3, and a third hole transport region HTR3. The third light generation layer LGL3 may be located between the third electron transport region ETR3 and the third hole transport region HTR3.

Each of the first hole transport region HTR1, the second hole transport region HTR2, and the third hole transport region HTR3 may include at least one of a hole injection layer or a hole transport layer, and further include a hole buffer layer, an electron support layer, and the like, if necessary. The first hole transport region HTR1, the second hole transport region HTR2, and the third hole transport region HTR3 may have the same configuration or different configurations.

Each of the first electron transport region ETR1, the second electron transport region ETR2, and the third electron transport region ETR3 may include at least one of an electron injection layer or an electron transport layer, and further include an electron buffer layer, a hole support layer, and the like, if necessary. The first electron transport region ETR1, the second electron transport region ETR2, and the third electron transport region ETR3 may have the same configuration or different configurations.

A first connection layer CGL1 may be located between the first light emitting structure part EU1 and the second light emitting structure part EU2. A second connection layer CGL2 may be located between the second light emitting structure part EU2 and the third light emitting structure part EU3.

The first light generation layer LGL1 and the third light generation layer LGL3 may generate light of a color different from a color of light generated by the second light generation layer LGL2. Lights respectively emitted from the first light generation layer LGL1, the second light generation layer LGL2, and the third light generation layer LGL3 may be mixed to generate white light. For example, the first light generation layer LGL1 and the third light generation layer LGL3 may generate blue light, and the second light generation layer LGL2 may generate yellow light.

However, embodiments according to the present disclosure are not limited thereto, and the second light generation layer LGL2 may further include a sub-light generation layer so as to improve purity.

The light emitting layer EML having the single light emitting structure, the light emitting layer EML having the two-stack tandem light emitting structure, and the light emitting layer EML having the three-stack tandem light emitting structure may be formed through vacuum deposition, inkjet printing, or the like, but embodiments according to the present disclosure are not limited thereto.

The second electrode EL2 may be located over the first light emitting layer EML1 of the first sub-pixel SPX1, the second light emitting layer EML of the second sub-pixel SPX2, and the third light emitting layer EML3 of the third sub-pixel SPX3.

The second electrode EL2 may be commonly provided in the first, second, and third sub-pixels SPX1, SPX2, and SPX3. The second electrode EL2 may be provided in a plate shape throughout the whole of the display area DA, but embodiments according to the present disclosure are not limited thereto. The second electrode EL2 may be a second conductive layer located on the circuit insulating layer PC_INS, but embodiments according to the present disclosure are not limited thereto.

The second electrode EL2 may be a thin metal layer having a thickness to a degree to which light emitted from each of the first light emitting layer EML1, the second light emitting layer EML2, and the third light emitting layer EML3 can be transmitted therethrough. The second electrode EL2 may be formed of a metal material to have a relatively thin thickness or be formed of a transparent conductive material. For example, the second electrode EL2 may be configured with various transparent conductive materials. The second electrode EL2 may include at least one of various transparent conductive materials including indium tin oxide, indium zinc oxide, indium tin zinc oxide, aluminum zinc oxide, gallium zinc oxide, zinc tin oxide, or gallium tin oxide, and be formed substantially transparent or translucent to satisfy a predetermined transmittance. Accordingly, light emitted from each of the first light emitting layer EML1, the second light emitting layer EML2, and the third light emitting layer EML3, which are located on the bottom of the second electrode EL2, can be emitted upwardly from the thin film encapsulating layer TFE while passing through the second electrode EL2.

The thin film encapsulation layer TFE may be entirely provided and/or formed on the second electrode EL2.

The thin film encapsulation layer TFE may include first, second, and third encap layers ENC1, ENC2, and ENC3 sequentially located on the second electrode EL2. The first encap layer ENC1 may be located on the light emitting element layer LDL, thereby being located throughout the display area DA and at least a portion of the non-display area NDA. The second encap layer ENC2 may be located on the first encap layer ENC1, thereby being located throughout the display area DA and at least a portion of the non-display area NDA. The third encap layer ENC3 may be located on the second encap layer ENC2, thereby being located throughout the display area DA and at least a portion of the non-display area NDA. In some embodiments, the third encap layer ENC3 may be located throughout the whole of the display area DA and the non-display area NDA.

Each of the first and third encap layers ENC1 and ENC3 may be configured as an inorganic layer including an inorganic material, and the second encap layer ENC2 may be configured as an organic layer including an organic material. The inorganic layer may include, for example, silicon nitride ($SiN_x$), silicon oxide ($SiO_x$), silicon oxynitride ($SiO_xN_y$), or the like. The organic layer may include an organic insulating material such as acrylic resin, epoxy resin, phenolic resin, polyamides resin, polyimides resin, polyester resin, polyphenylene sulfide resin, or benzocyclobutene (BCB).

The color filter layer CFL may be located on the thin film encapsulation layer TFE. The color filter layer CFL may include a color filter CF and a light blocking pattern BM.

The light blocking pattern BM may be located on one surface of the thin film encapsulation layer TFE to correspond to the pixel defining layer PDL. The light blocking pattern BM may include a light blocking material. For example, the light blocking pattern BM may be a black matrix. In some embodiments, the light blocking pattern BM may be configured to include at least one light blocking material and/or at least one reflective material.

The color filter CF may include a first color filter CF1, a second color filter CF2, and a third color filter CF3. The first color filter CF1 may be located in the first sub-pixel SPX1, the second color filter CF2 may be located in the second sub-pixel SPX2, and the third color filter CF3 may be located in the third sub-pixel SPX3. The first color filter CF1 may be located on the one surface of the thin film encapsulation layer TFE to correspond to the first light emitting layer EML1 in the first emission area EMA1. The second color filter CF2 may be located on the one surface of the thin film encapsulation layer TFE to correspond to the second light emitting layer EML2 in the second emission area EMA2. The third color filter CF3 may be located on the one surface of the thin film encapsulation layer TFE to correspond to the third light emitting layer EML3 in the third emission area EMA3.

Each of the first, second, and third color filters CF1, CF2, and CF3 may include a colorant, such as a dye or a pigment, which absorbs wavelengths except a corresponding color wavelength. The first color filter CF1 may be a red color filter, the second color filter CF2 may be a green color filter, and the third color filter CF3 may be a blue color filter. Although a case where adjacent color filters CF are spaced apart from each other with the light blocking pattern BM interposed therebetween, the adjacent color filters CF may at least partially overlap with each other on the light blocking pattern BM.

The overcoat layer OC may be located over the above-described color filter layer CFL.

The overcoat layer OC may be located over the color filter layer CFL to cover a lower member including the color filter layer CFL. The overcoat layer OC may prevent or reduce damage or contamination to the color filter layer CFL due to infiltration of an impurity such as moisture or air from the outside. Also, the overcoat layer OC may prevent or reduce instances of a colorant of the color filter layer CFL being diffused into another component. The overcoat layer OC may include an inorganic insulating layer including an inorganic material, but embodiments according to the present disclosure are not limited thereto.

In accordance with the above-described embodiments, the conductive pattern CP configured with the first conductive layer (e.g., the source-drain layer) located directly on the circuit insulating layer PC_INS (or the circuit board 100) and the first electrode EL1 corresponding to an anode of the light emitting element LD are integrally formed, so that a separate manufacturing process for forming the anode is omitted, thereby improving the manufacturing efficiency of the display device DD.

In accordance with the above-described embodiments, as the first electrode EL1 is located directly on the circuit insulating layer PC_INS, the existing via layer (or planarization layer) located between the first electrode EL1 and the circuit insulating layer PC_INS is omitted, thereby further improving the manufacturing efficiency of the display device DD.

In accordance with the above-described embodiments, as the conductive layer including the first electrode EL1 and the conductive pattern CP includes the aluminum-nickel-lanthanum-based alloy configured with aluminum of 99.94 at %, nickel of 0.02 at %, and lanthanum of 0.04 at %, the aluminum-nickel-lanthanum-based alloy becomes a hillock-free layer, so that the reliability of a line can be improved.

Figure 14:
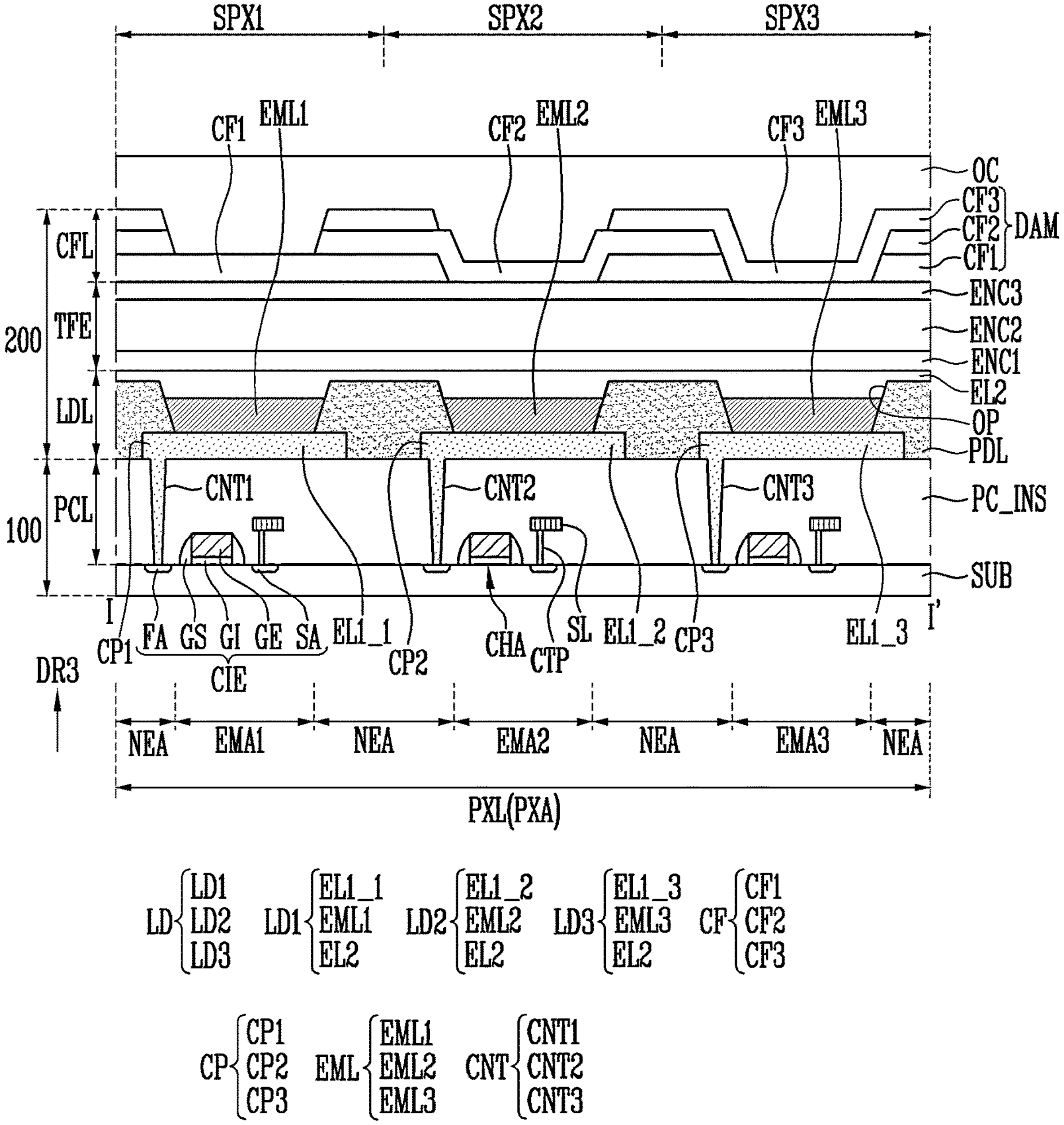
FIG. 14 illustrates a pixel according to some embodiments of the present disclosure, and is a schematic cross-sectional view corresponding to the line I-I' shown in FIG. 6.

FIG. 14 illustrates a pixel PXL according to some embodiments of the present disclosure, and is a schematic cross-sectional view corresponding to the line I-I' shown in FIG. 6.

In relation to the embodiments shown in FIG. 14, portions different from those of the above-described embodiments will be mainly described to avoid redundancy.

Portions not particularly described in the embodiments shown in FIG. 14 follow those of the above-described embodiments. Identical reference numerals refer to identical components, and similar reference numerals refer to similar components.

Referring to FIGS. 6 and 14, the pixel PXL may include a circuit board 100, a display element layer 200, and an overcoat layer OC.

The display element layer 200 may include a light emitting element layer LDL, a thin film encapsulation layer TFE, and a color filter layer CFL.

The color filter layer CFL may include a first color filter CF1, a second color filter CF2, and a third color filter CF3. The first color filter CF1 may be located on one surface of the thin film encapsulation layer TFE to correspond to a first light emitting layer EML1 in a first sub-pixel SPX1, the second color filter CF2 may be located on the one surface of the thin film encapsulation layer TFE to correspond to a second light emitting layer EML2 in a second sub-pixel SPX2, and the third color filter CF3 may be located on the one surface of the thin film encapsulation layer TFE to correspond to a third light emitting layer EML3 in a third sub-pixel SPX3. For example, the first color filter CF1 may include a red color filter, the second color filter CF2 may include a green color filter, and the third color filter CF3 may include a blue color filter.

The first color filter CF1, the second color filter CF2, and the third color filter CF3 may overlap with each other in a non-emission area NEA, to be used as a dam part DAM (or light blocking member) which blocks light interference between adjacent sub-pixels. The dam part DAM may be located on the one surface of the thin film encapsulation layer TFE to correspond to a pixel defining layer PDL. The dam part DAM along with the pixel defining layer PDL may be a structure which defines a first emission area EMA1 of the first sub-pixel SPX1, a second emission area EMA2 of the second sub-pixel SPX2, and a third emission area EMA3 of the third sub-pixel SPX3.

Figure 15:
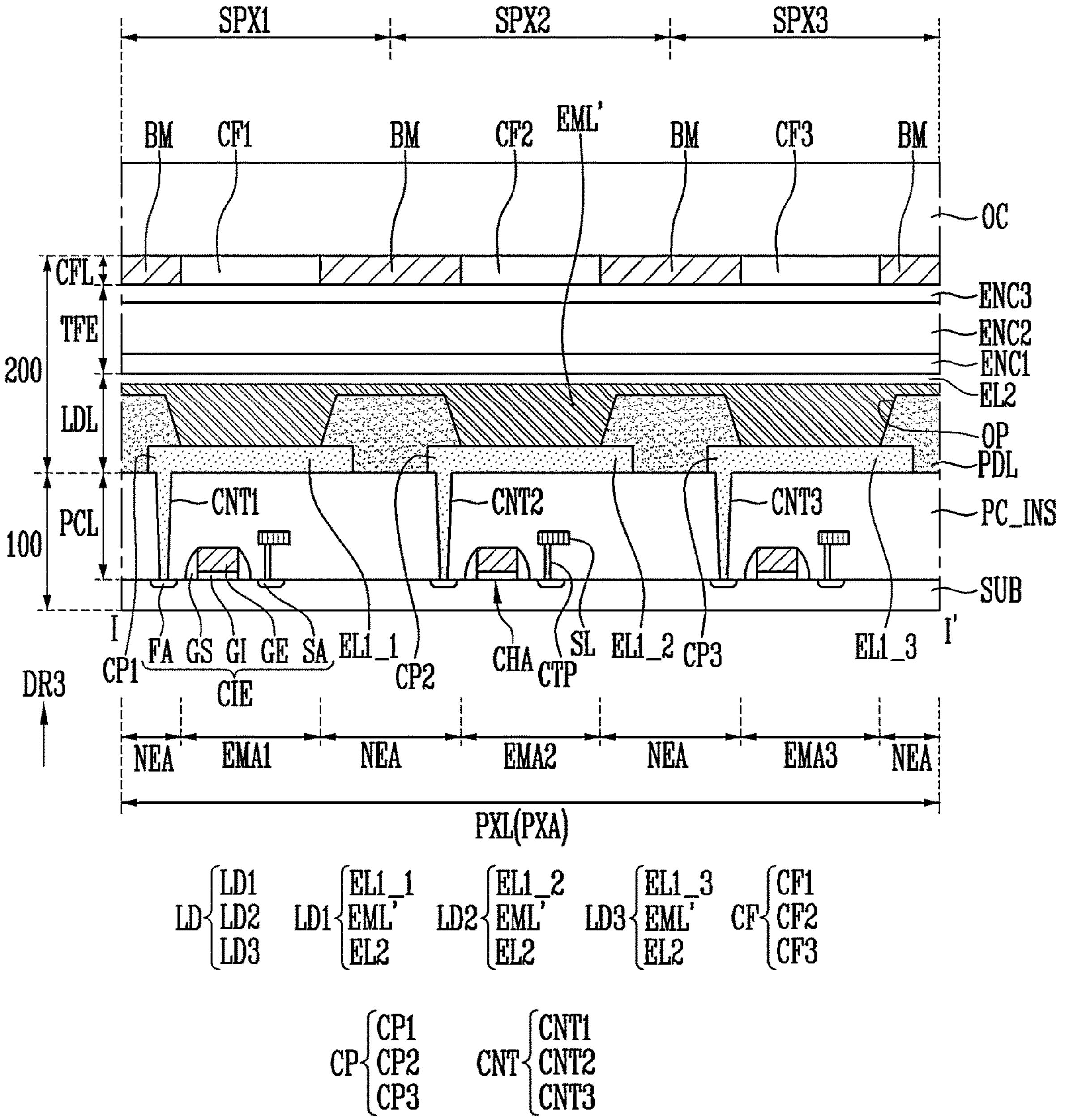
FIG. 15 illustrates a pixel according to some embodiments of the present disclosure, and is a schematic cross-sectional view corresponding to the line I-I' shown in FIG. 6.

FIG. 15 illustrates a pixel PXL according to some embodiments of the present disclosure, and is a schematic cross-sectional view corresponding to the line I-I' shown in FIG. 6.

In relation to the embodiments shown in FIG. 15, portions different from those of the above-described embodiments will be mainly described to avoid redundancy.

Portions not particularly described in the embodiments shown in FIG. 15 follow those of the above-described embodiments. Identical reference numerals refer to identical components, and similar reference numerals refer to similar components.

Referring to FIGS. 6 and 15, the pixel PXL may include a circuit board 100, a display element layer 200, and an overcoat layer OC.

The display element layer 200 may include a light emitting element layer LDL, a thin film encapsulation layer TFE, and a color filter layer CFL.

The light emitting element layer LDL may include a light emitting element LD and a pixel defining layer PDL. The light emitting element LD may include a first light emitting element LD1 located in a first sub-pixel SPX1, a second light emitting element LD2 located in a second sub-pixel SPX2, and a third light emitting element LD3 located in a third sub-pixel SPX3.

The first light emitting element LD1 may include a (1-1)th electrode EL1_1, a light emitting layer EML', and a second electrode EL2. The second light emitting element LD2 may include a (1-2)th electrode EL1_2, the light emitting layer EML', and the second electrode EL2. The third light emitting element LD3 may include a (1-3)th electrode EL1_3, the light emitting layer EML', and the second electrode EL2. The (1-1)th electrode EL1_1 may be an anode of the first light emitting element LD1, the (1-2)th electrode EL1_2 may be an anode of the second light emitting element LD2, and the (1-3)th electrode EL1_3 may be an anode of the third light emitting element LD3.

The light emitting layer EML' may be located on the (1-1)th, (1-2)th, and (1-3)th electrodes EL1_1, EL1_2, and EL1_3 exposed by openings OP of the pixel defining layer PDL. Also, the light emitting layer EML' may be located on a side surface and a top surface of the pixel defining layer PDL. The light emitting layer EML' may be a common layer commonly provided in the first, second, and third sub-pixels SPX1, SPX2, and SPX3.

The light emitting layer EML' may have a multi-layer thin film structure including a light generation layer for generating light. For example, the light emitting layer EML' may include a hole injection layer for injecting holes, a hole transport layer for increasing a hole recombination opportunity by suppressing movement of electrons which are excellent in transportability of holes and are not combined in a light generation layer, the light generation layer for emitting light by recombination of the injected electrons and holes, a hole blocking layer for suppressing the movement of the holes that are not combined in the light generation layer, an electron transport layer for smoothly transporting the electrons to the light generation layer, and an electron injection layer for injecting the electrons. However, embodiments according to the present disclosure are not limited thereto.

According to some embodiments, the light emitting layer EML' may emit light of white.

Each of first to third color filters CF1, CF2, and CF3 may include a color filter material which allows light having a specific wavelength band in the light of white, which passes through the corresponding light emitting layer EML', to be selectively transmitted therethrough. For example, the first color filter CF1 may be a red color filter, the second color filter CF2 may be a green color filter, and the third color filter CF3 may be a blue color filter. However, embodiments according to the present disclosure are not limited thereto.

Figure 16:
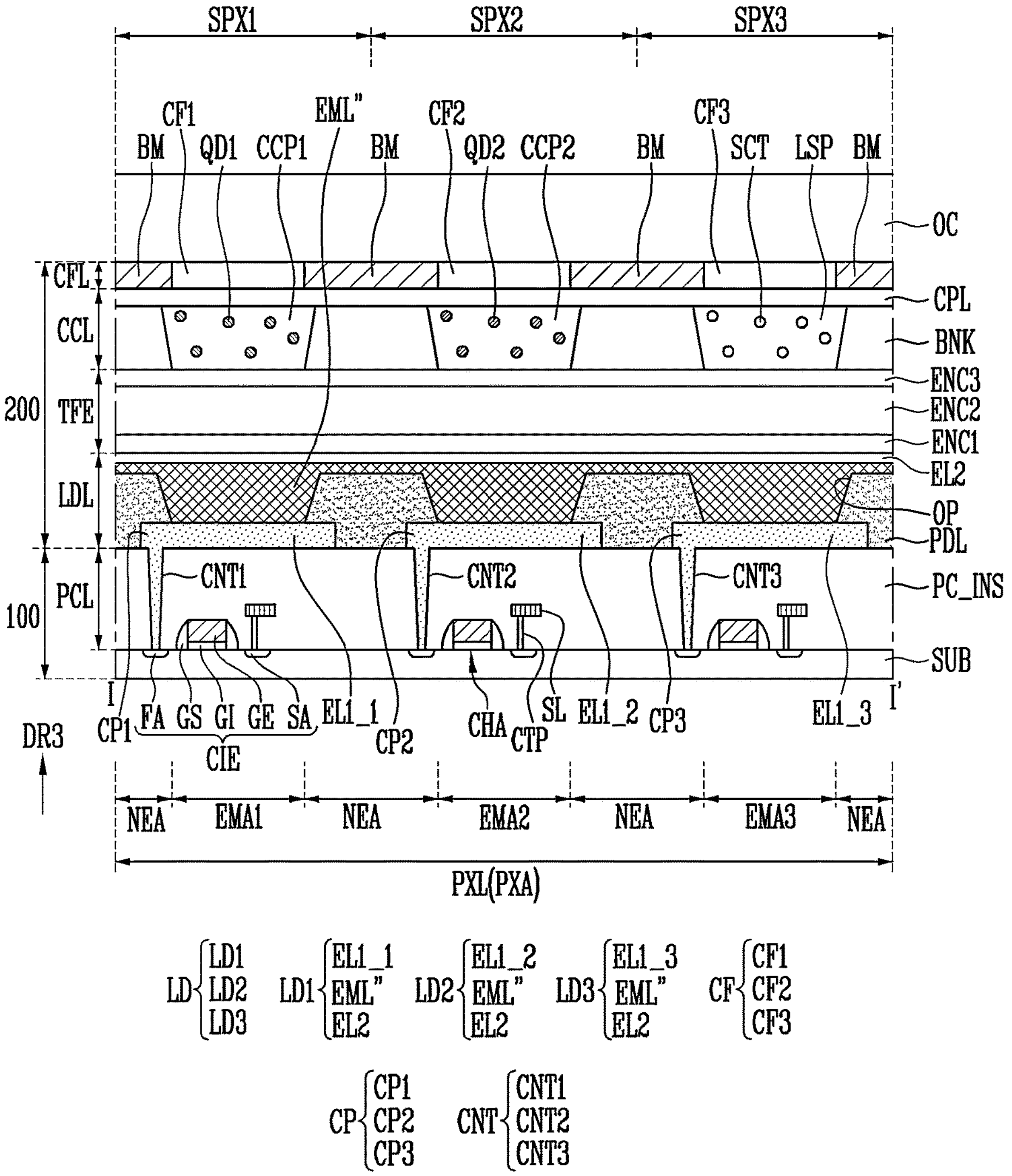
FIG. 16 illustrates a pixel according to some embodiments of the present disclosure, and is a schematic cross-sectional view corresponding to the line I-I' shown in FIG. 6.

FIG. 16 illustrates a pixel PXL according to some embodiments of the present disclosure, and is a schematic cross-sectional view corresponding to the line I-I' shown in FIG. 6.

In relation to the embodiments shown in FIG. 16, portions different from those of the above-described embodiments will be mainly described to avoid redundancy.

Portions not particularly described in the embodiments shown in FIG. 16 follow those of the above-described embodiments. Identical reference numerals refer to identical components, and similar reference numerals refer to similar components.

Referring to FIGS. 6 and 16, the pixel PXL may include a circuit board 100, a display element layer 200, and an overcoat layer OC.

The display element layer 200 may include a light emitting element layer LDL, a thin film encapsulation layer TFE, a color conversion layer CCL, and a color filter layer CFL.

The light emitting element layer LDL may include a first light emitting element LD1 located in a first sub-pixel SPX1, a second light emitting element LD2 located in a second sub-pixel SPX2, a third light emitting element LD3 located in a third sub-pixel SPX3, and a pixel defining layer PDL.

The first light emitting element LD1 may include a (1-1)th electrode EL1_1, a light emitting layer EML', and a second electrode EL2. The second light emitting element LD2 may include a (1-2)th electrode EL1_2, the light emitting layer EML', and the second electrode EL2. The third light emitting element LD3 may include a (1-3)th electrode EL1_3, the light emitting layer EML', and the second electrode EL2.

The light emitting layer EML' may be a common layer commonly provided in the first, second, and third sub-pixels SPX1, SPX2, and SPX3. The light emitting layer EML' may have a multi-layer thin film structure including a light generation layer for generating light. According to some embodiments, the light emitting layer EML' may emit blue series light.

The second electrode EL2 may be provided and/or formed on the light emitting layer EML'.

The thin film encapsulation layer TFE may be entirely provided and/or formed on the second electrode EL2.

The color conversion layer CCL may be provided and/or formed on the thin film encapsulation layer TFE.

The color conversion layer CCL may include a first color conversion pattern CCP1, a second color conversion pattern CCP2, a light scattering pattern LSP, and a bank BNK.

The first color conversion pattern CCP1 may be located on one surface of the thin film encapsulation layer TFE to correspond to the light emitting layer EML' in the first sub-pixel SPX1, and include first color conversion particles QD1 which convert light emitted from the light emitting layer EML', e.g., blue series light into red series light (or light of a specific color).

The second color conversion pattern CCP2 may be located on the one surface of the thin film encapsulation layer TFE to correspond to the light emitting layer EML' in the second sub-pixel SPX2, and include second color conversion particles QD2 which convert light emitted from the light emitting layer EML', e.g., blue series light into green series light (or light of a specific color).

The light scattering pattern LSP may be located on the one surface of the thin film encapsulation layer TFE to correspond to the light emitting layer EML' in the third sub-pixel SPX3, and be a transparent layer (or transparent window) which allows light emitted from the light emitting layer EML', e.g., blue series light to be transmitted therethrough as it is. The light scattering pattern LSP may include light scattering particles SCT for scattering blue series light emitted from the light emitting layer EML' in various directions.

The bank BNK may be located on the one surface of the thin film encapsulation layer TFE to correspond to the pixel defining layer PDL. The bank BNK may be a structure defining a forming position of the first color conversion pattern CCP1, a forming position of the second color conversion pattern CCP2, and a forming position of the light scattering pattern LSP.

The bank BNK may include at least one light blocking material and/or at least one reflective material (or scattering material). In some embodiments, the bank BNK may include a transparent material (or substance). The transparent material may include, for example, polyimide resin, polyamide resin, and the like, but embodiments according to the present disclosure are not limited thereto. In other embodiments, a reflective material layer may be separately provided and/or formed on the bank BNK so as to further improve the efficiency of light emitted from each of the first, second, and third sub-pixels SPX1, SPX2, and SPX3.

A capping layer CPL may be provided and/or formed on the color conversion layer CCL. The capping layer CPL may cover the color conversion layer CCL, thereby being used as a protective layer for protecting the color conversion layer CCL, but embodiments according to the present disclosure are not limited thereto. The capping layer CPL may be an inorganic insulating layer including an inorganic material or an organic insulating layer including an organic material.

The color filter layer CFL may be provided and/or formed on the capping layer CPL.

The color filter layer CFL may include a first color filter CF1 corresponding to the first color conversion layer CCP1, a second color filter CF2 corresponding to the second color conversion layer CCP2, and a third color filter CF3 corresponding to the light scattering pattern LSP. For example, the first color filter CF1 may be a red color filter, the second color filter CF2 may be a green color filter, and the third color filter CF3 may be a blue color filter. However, embodiments according to the present disclosure are not limited thereto.

Figure 17:
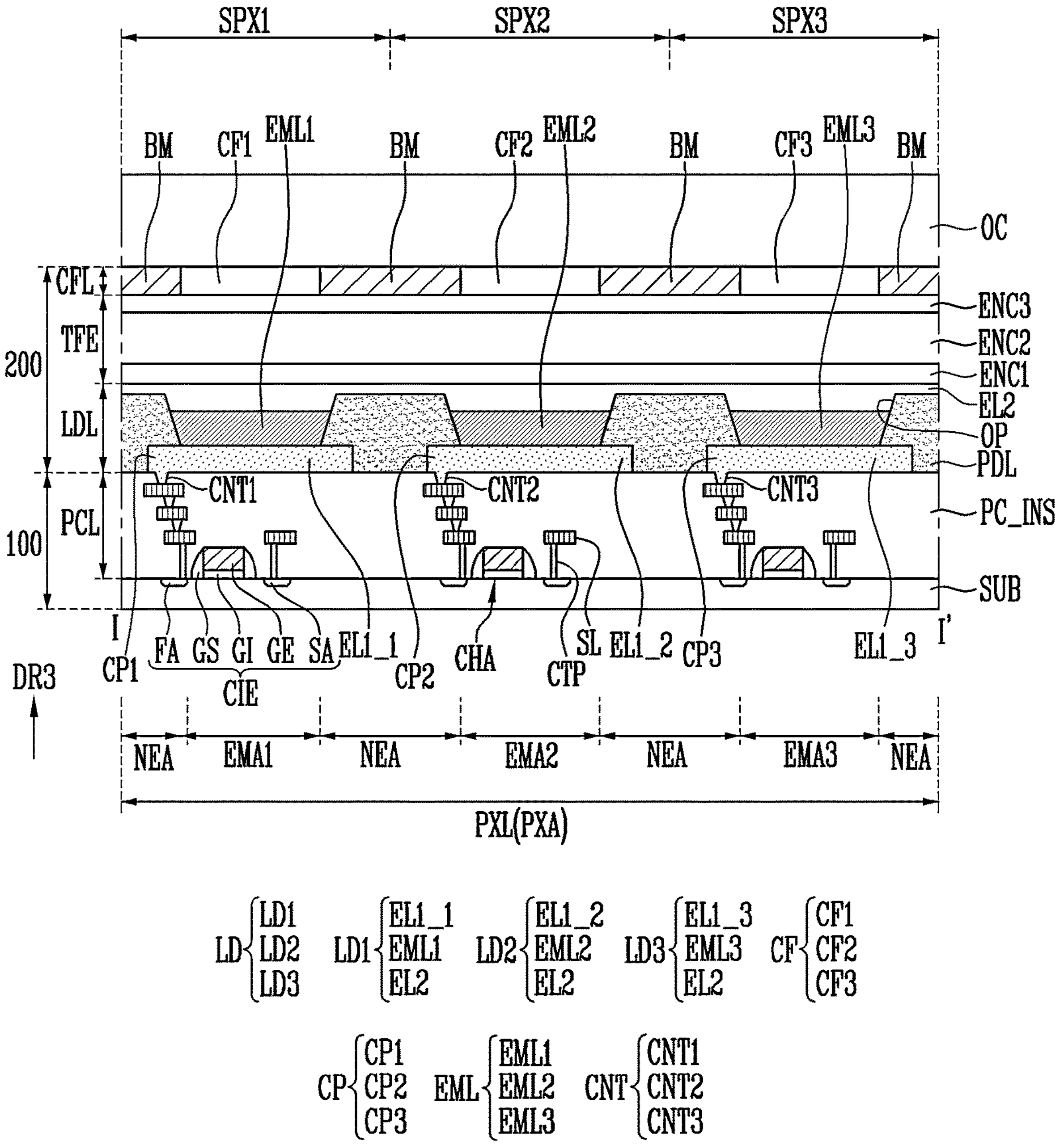
FIG. 17 illustrates a pixel according to some embodiments of the present disclosure, and is a schematic cross-sectional view corresponding to the line I-I' shown in FIG. 6.

FIG. 17 illustrates a pixel PXL according to some embodiments of the present disclosure, and is a schematic cross-sectional view corresponding to the line I-I' shown in FIG. 6.

In relation to the embodiments shown in FIG. 17, portions different from those of the above-described embodiments will be mainly described to avoid redundancy.

Portions not particularly described in the embodiments shown in FIG. 17 follow those of the above-described embodiments. Identical reference numerals refer to identical components, and similar reference numerals refer to similar components.

Referring to FIGS. 6 and 17, the pixel PXL may include a circuit board 100, a display element layer 200, and an overcoat layer OC.

The circuit board 100 may include a substrate SUB and a circuit element layer PCL.

The circuit element layer PCL may include circuit elements CIE, a circuit insulating layer PC_INS, mutual connection parts CTP, and circuit lines SL.

The circuit element CIE may include a transistor formed on the substrate SUB including a silicon wafer. The transistor may include a gate insulating layer GI, a gate electrode GE, and a gate spacer GS. First and second regions FA and SA may be located in the substrate SUB at both sides of the gate electrode GE. The first and second regions FA and SA may correspond to a semiconductor layer including silicon.

The first region FA of the circuit element CIE may be electrically connected to the circuit line SL through the mutual connection part CTP. The circuit insulating layer PC_INS may include a contact part exposing a portion of the circuit line SL electrically connected to the first region FA. For example, the circuit insulating layer PC_INS may include a first contact part CNT1 exposing a portion of a circuit line SL electrically connected to a first region FA in a first sub-pixel SPX1, a second contact part CNT2 exposing a portion of a circuit line SL electrically connected to a first region FA in a second sub-pixel SPX2, and a third contact part CNT3 exposing a portion of a circuit line SL electrically connected to a first region FA in a third sub-pixel SPX3.

A source-drain layer including a conductive pattern CP and a first electrode EL1, which are integrally formed, may be located on the circuit insulating layer PC_INS. The source-drain layer may be a first conductive layer located on the circuit insulating layer PC_INS. The first electrode EL1 may include a (1-1)th electrode EL1_1 of the first sub-pixel SPX1, a (1-2)th electrode EL1_2 of the second sub-pixel SPX2, and a (1-3)th electrode EL1_3 of the third sub-pixel SPX3. The conductive pattern CP may include a first conductive pattern CP1 integrally formed with the (1-1)th electrode EL1_1, a second conductive pattern CP2 integrally formed with the (1-2)th electrode EL1_2, and a third conductive pattern CP3 integrally formed with the (1-3)th electrode EL1_3.

According to some embodiments, the first conductive pattern CP1 (or the (1-1)th electrode EL1_1) may be connected to a circuit line SL through the first contact part CNT1, to be electrically connected to a first region FA of a corresponding circuit element CIE. The second conductive pattern CP2 (or the (1-2)th electrode EL1_2) may be connected to a circuit line SL through the second contact part CNT2, to be electrically connected to a first region FA of a corresponding circuit element CIE. The second conductive pattern CP3 (or the (1-3)th electrode EL1_3) may be connected to a circuit line SL through the third contact part CNT3, to be electrically connected to a first region FA of a corresponding circuit element CIE.

As described above, the conductive pattern CP (or the first electrode EL1) located on the circuit insulating layer PC_INS can be electrically connected to a first region FA of a circuit element CIE through a circuit line SL exposed by a corresponding contact part CNT.

In accordance with some embodiments of the present disclosure, there can be provided a display device in which a conductive pattern located on an insulating layer covering a circuit element on a silicon substrate and a first electrode (or anode) of a light emitting element are integrally formed, so that a separate process for forming the first electrode is omitted, thereby improving the manufacturing efficiency of the display device.

In accordance with some embodiments of the present disclosure, there can be provided a display device in which a separate planarization layer (or via layer) is omitted, thereby further improving the manufacturing efficiency of the display device.

In accordance with some embodiments of the present disclosure, there can be provided a display device in which a conductive pattern and a first electrode is configured in a multi-layer structure including a first layer, a second layer, and a third layer, which are sequentially stacked, and the second layer is configured with an aluminum-nickel-lanthanum-based alloy, thereby improving the reliability of the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with particular embodiments may be used singly or in combination with features, characteristics, and/or elements described in connection with other embodiments unless otherwise specifically indicated. Accordingly, it will be understood by those of skill in the art that various changes in form and details may be made without departing from the scope of the present disclosure as set forth in the following claims, and their equivalents.

What is claimed is:

1. A display device comprising:

a substrate on which an emission area and a non-emission area are defined;

an insulating layer covering a circuit element on the substrate, the insulating layer including a contact part exposing a portion of the circuit element;

a conductive pattern on the insulating layer, the conductive pattern being electrically connected to the circuit element through the contact part;

a first electrode on the insulating layer, the first electrode being integrally formed with the conductive pattern;

a pixel defining layer over the first electrode, the pixel defining layer including an opening exposing a portion of the first electrode;

a light emitting layer on the first electrode; and a second electrode on the light emitting layer, wherein the conductive pattern and the first electrode include a first layer, a second layer, and a third layer, which are sequentially stacked on one surface of the insulating layer, and wherein the second layer includes an aluminum-nickel-lanthanum-based alloy.

2. The display device of claim 1, wherein the substrate includes a silicon wafer substrate.

3. The display device of claim 2, wherein the second layer includes aluminum of 99.94 at %, nickel of 0.02 at %, and lanthanum of 0.04 at %.

4. The display device of claim 3, wherein the first layer, the second layer, and the third layer include different materials.

5. The display device of claim 4, wherein the first layer includes titanium, and the third layer includes tungsten oxide.

6. The display device of claim 5, wherein the conductive pattern and the first electrode further include a fourth layer on the third layer, and wherein the fourth layer includes a transparent conductive material.

7. The display device of claim 6, wherein the second layer has a thickness thicker than a thickness of each of the first, third, and fourth layers.

8. The display device of claim 6, wherein the first layer is in direct contact with the circuit element through the contact part.

9. The display device of claim 8, wherein the circuit element includes a gate insulating layer, a gate electrode on the gate insulating layer, and source and drain regions in the substrate at both sides of the gate electrode, and wherein one of the source and drain regions is connected to the first layer and in direct contact with the first layer through the contact part.

10. The display device of claim 9, wherein the first layer is a barrier layer, the second layer is a reflective layer, the third layer is an ohmic contact layer, and the fourth layer is a hole injection layer.

11. The display device of claim 8, wherein the circuit element includes:

a gate insulating layer;

a gate electrode on the gate insulating layer;

source and drain regions in the substrate at both sides of the gate electrode;

a mutual connection part electrically connected to one of the source and drain regions; and a signal line electrically connected to the mutual connection part, and wherein the first layer is electrically connected to the signal line through the contact part.

12. The display device of claim 2, further comprising:

a thin film encapsulation layer over the second electrode;

a color filter layer on the thin film encapsulation layer; and an overcoat layer over the color filter layer.

13. The display device of claim 12, wherein the color filter layer includes:

a color filter on the thin film encapsulation layer in the emission area; and a light blocking pattern on the thin film encapsulation layer in the non-emission area.

14. The display device of claim 12, wherein the color filter layer includes:

a color filter on the thin film encapsulation layer in the emission area; and a dam part on the thin film encapsulation layer in the non-emission area, wherein the dam part includes a first color filter, a second color filter, and a third color filter, which are sequentially stacked, and wherein the color filter includes one of the first, second, and third color filters.

15. The display device of claim 12, further comprising a color conversion layer between the thin film encapsulation layer and the color filter layer, wherein the color conversion layer further includes a bank on the thin film encapsulation layer in the non-emission area and a color conversion pattern on the thin film encapsulation layer in the emission area, and wherein the light emitting layer emits blue light.

16. The display device of claim 1, wherein the conductive pattern and the first electrode correspond to a first conductive layer on the insulating layer.

17. A display device comprising:

first, second, and third sub-pixels each including an emission area and a non-emission area, wherein each of the first, second, and third sub-pixels includes:

a substrate;

an insulating layer covering a circuit element on the substrate, the insulating layer including a contact part exposing a portion of the circuit element;

a conductive pattern on the insulating layer, the conductive pattern being electrically connected to the circuit element through the contact part;

a first electrode on the insulating layer, the first electrode being integrally formed with the conductive pattern;

a pixel defining layer over the first electrode, the pixel defining layer including an opening exposing a portion of the first electrode;

a light emitting layer on the first electrode; and a second electrode on the light emitting layer, wherein the conductive pattern and the first electrode include a first layer, a second layer, a third layer, and a fourth layer, which are sequentially stacked on one surface of the insulating layer, wherein the first layer, the second layer, the third layer, and the fourth layer include different materials, and wherein the second layer includes an aluminum-nickel-lanthanum-based alloy.

18. The display device of claim 17, wherein the substrate includes a silicon wafer substrate.

19. The display device of claim 17, wherein the second layer includes aluminum of 99.94 at %, nickel of 0.02 at %, and lanthanum of 0.04 at %.

20. The display device of claim 19, wherein the first layer includes titanium, the third layer includes tungsten oxide, and the fourth layer includes indium tin oxide.

* * * * *